United States Patent
Okahisa

(10) Patent No.: US 11,287,622 B2
(45) Date of Patent: Mar. 29, 2022

(54) LIGHT SOURCE MODULE

(71) Applicant: NICHIA CORPORATION, Anan (JP)

(72) Inventor: Tsuyoshi Okahisa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 302 days.

(21) Appl. No.: 16/425,842

(22) Filed: May 29, 2019

(65) Prior Publication Data

US 2019/0369375 A1 Dec. 5, 2019

(30) Foreign Application Priority Data

May 31, 2018 (JP) .............................. JP2018-104288

(51) Int. Cl.

| | |
|---|---|
| *G02B 19/00* | (2006.01) |
| *F21V 5/04* | (2006.01) |
| *F21V 5/08* | (2006.01) |
| *F21V 8/00* | (2006.01) |
| *H01L 33/58* | (2010.01) |
| *F21Y 115/10* | (2016.01) |

(52) U.S. Cl.
CPC ............ *G02B 19/0028* (2013.01); *F21V 5/04* (2013.01); *F21V 5/08* (2013.01); *G02B 6/0036* (2013.01); *G02B 19/0061* (2013.01); *H01L 33/58* (2013.01); *F21Y 2115/10* (2016.08)

(58) Field of Classification Search
CPC ............ G02B 19/0028; G02B 19/0061; G02B 6/0036; F21V 5/08; H01L 33/58
See application file for complete search history.

(56) References Cited

U.S. PATENT DOCUMENTS

| | | | |
|---|---|---|---|
| 2012/0057101 A1 | 3/2012 | Iiyama et al. | |
| 2014/0146546 A1 | 5/2014 | Yamada et al. | |
| 2014/0204591 A1 | 7/2014 | Kim et al. | |
| 2014/0268723 A1* | 9/2014 | Stein ..................... | F21S 43/315 |
| | | | 362/218 |
| 2014/0293613 A1 | 10/2014 | Saito | |

(Continued)

FOREIGN PATENT DOCUMENTS

| | | |
|---|---|---|
| CN | 204176556 U | 2/2015 |
| JP | 2010-152282 A | 7/2010 |

(Continued)

*Primary Examiner* — Rajarshi Chakraborty
*Assistant Examiner* — Nathaniel J Lee
(74) *Attorney, Agent, or Firm* — Foley & Lardner LLP

(57) ABSTRACT

A light source module comprising: a light source having an upper surface comprising a light emission surface; and a light guide member including a lens portion having a central axis that extends through a center of the light emission surface. The lens portion includes: an incidence surface, a reflection surface, and an emitting surface. The incidence surface comprises an upper incidence region positioned on an upper side, and a lower incidence region positioned lower than the upper incidence region, in a cross section that includes the central axis. The lower incidence region has 2-fold rotational symmetry. The lower incidence region includes a first lower incidence region, and a second lower incidence region at a position rotated by 45 degrees from the first lower incidence region. A height of the second lower incidence region is greater than a height of the first lower incidence region.

17 Claims, 21 Drawing Sheets

(56) References Cited

U.S. PATENT DOCUMENTS

| | | | |
|---|---|---|---|
| 2015/0285442 A1* | 10/2015 | Smith | F21V 13/04 |
| | | | 362/309 |
| 2016/0223157 A1* | 8/2016 | Saito | F21V 3/00 |
| 2018/0051863 A1 | 2/2018 | Lee et al. | |
| 2019/0285245 A1 | 9/2019 | Shinohara et al. | |

FOREIGN PATENT DOCUMENTS

| | | | |
|---|---|---|---|
| JP | 2013-030446 A | 2/2013 | |
| JP | 2014-209158 A | 11/2014 | |
| JP | 2015-161872 A | 9/2015 | |
| JP | 2016-046067 A | 4/2016 | |
| JP | 2018-029182 A | 2/2018 | |
| JP | 2018-061024 A | 4/2018 | |
| JP | 2018-078001 A | 5/2018 | |
| JP | 2018-137053 A | 8/2018 | |
| WO | WO-2011/114608 A1 | 9/2011 | |
| WO | WO-2012/176393 A1 | 12/2012 | |
| WO | WO-2013/141649 A1 | 9/2013 | |
| WO | WO-2018/151224 A1 | 8/2018 | |

\* cited by examiner

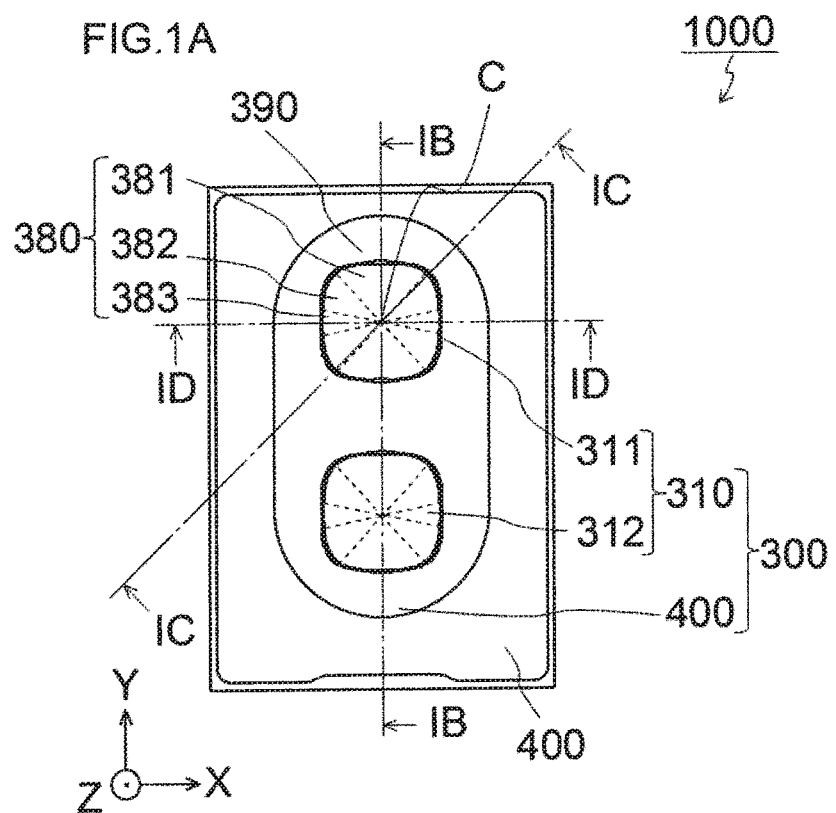

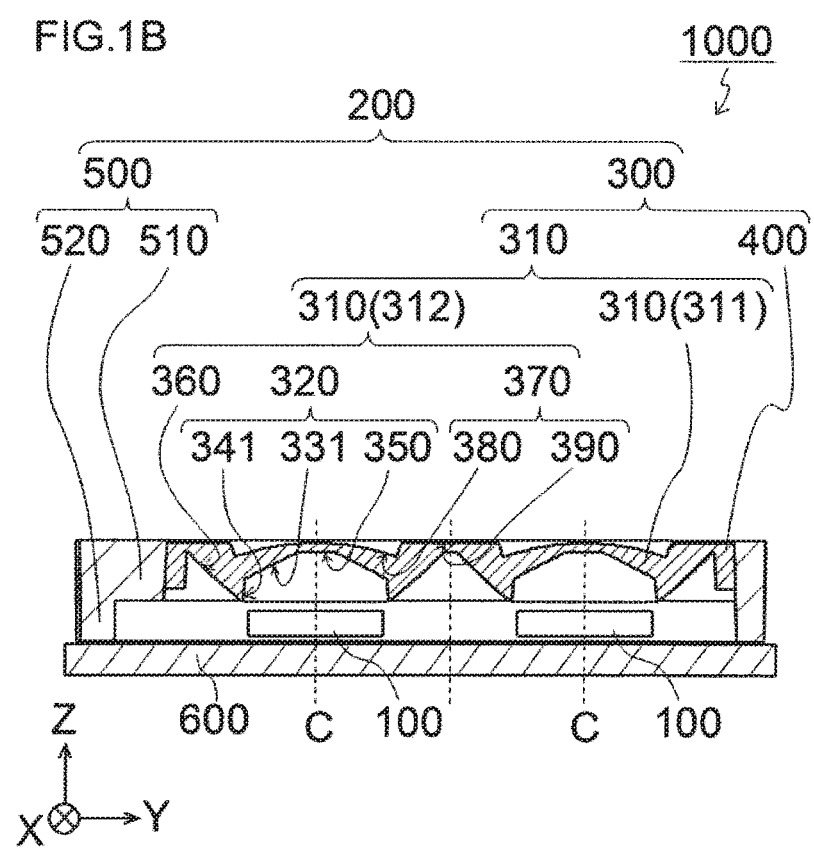

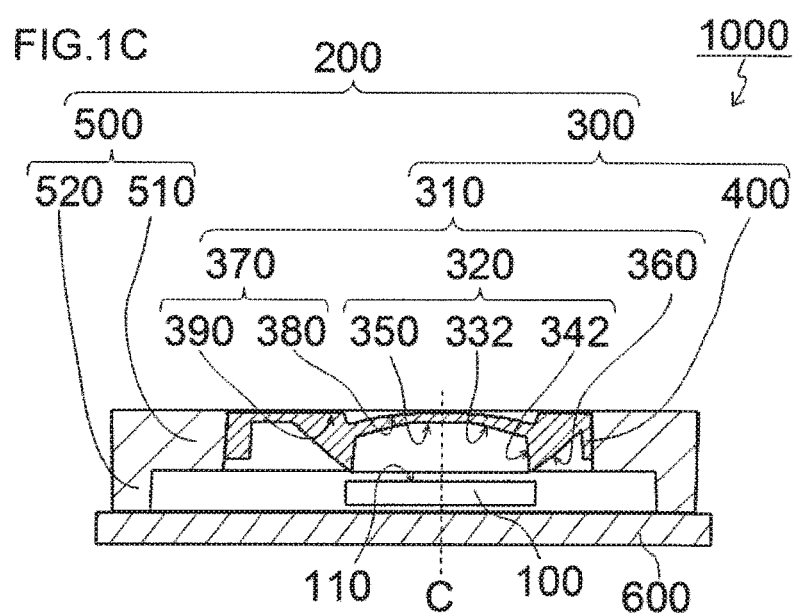

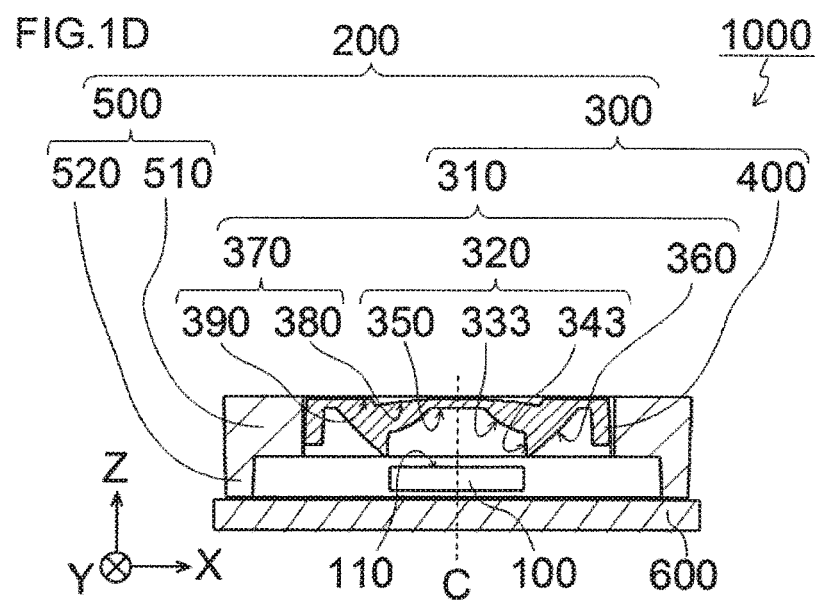

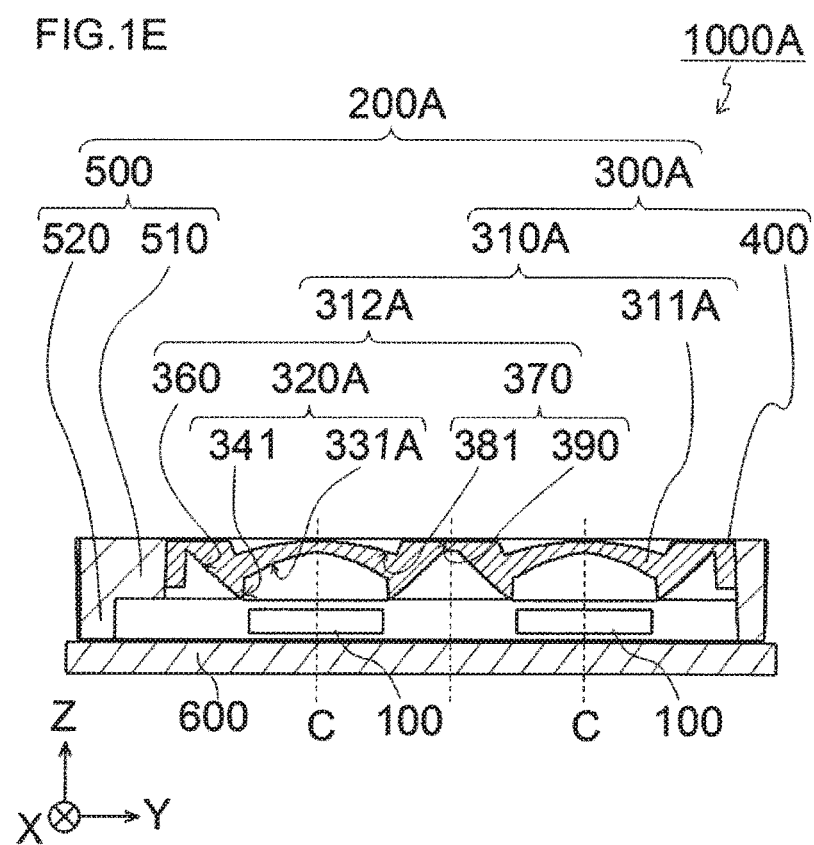

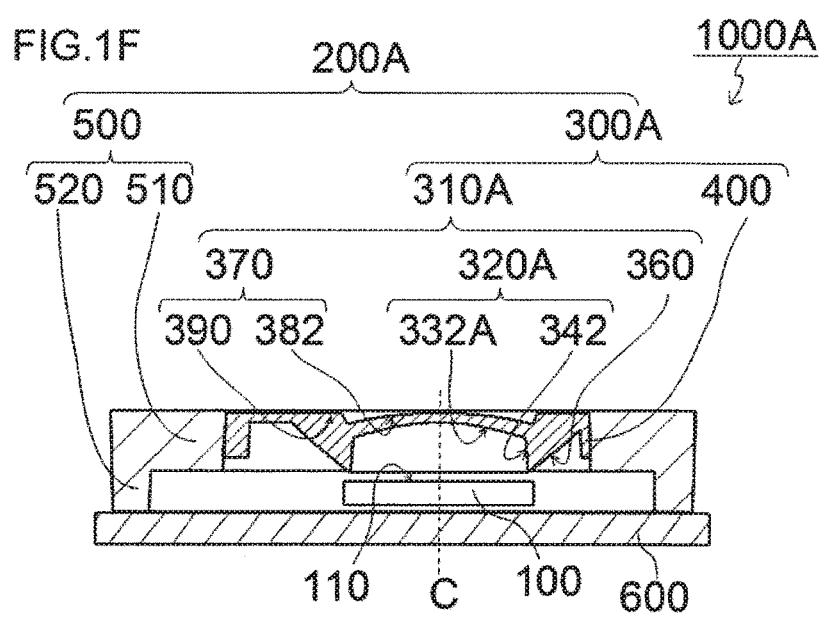

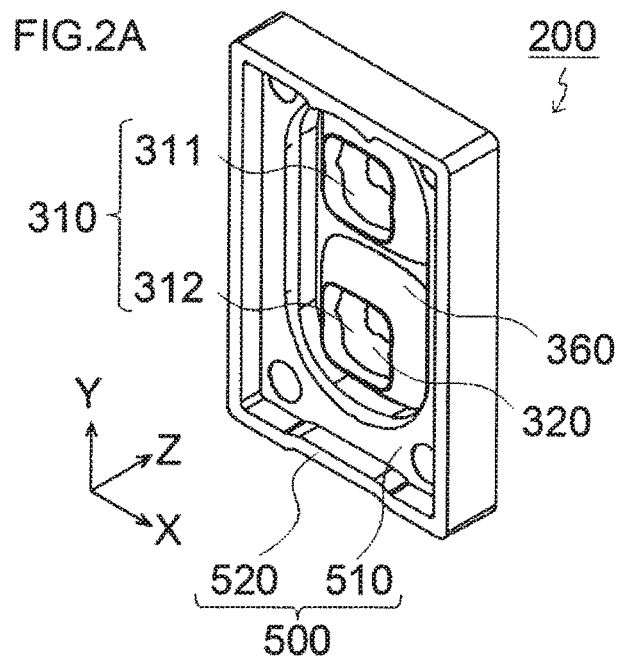

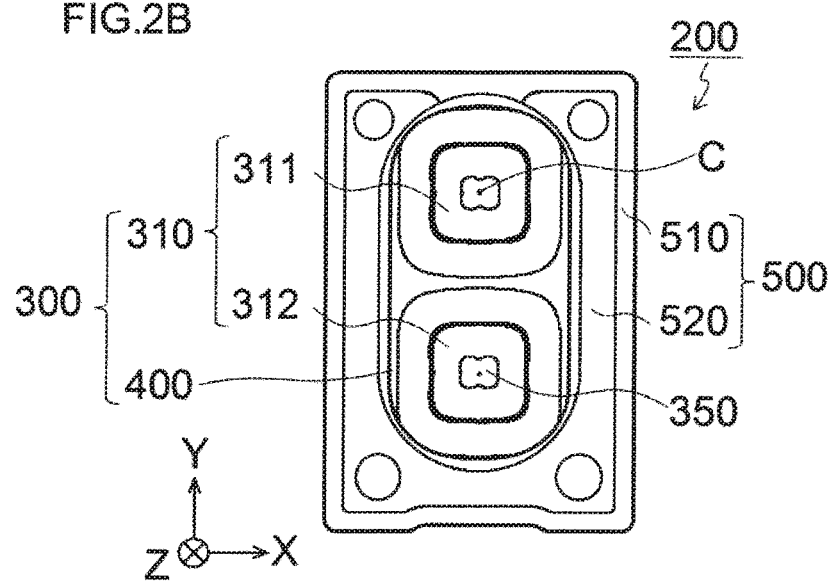

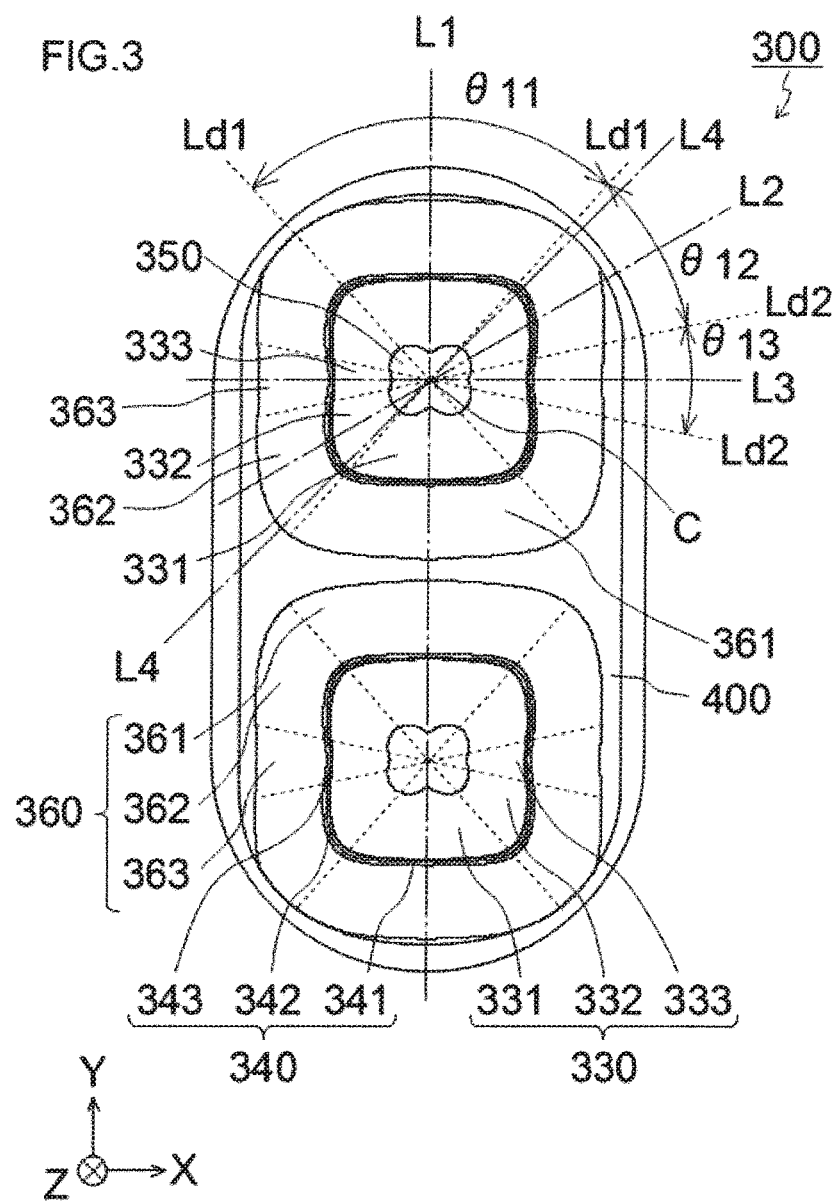

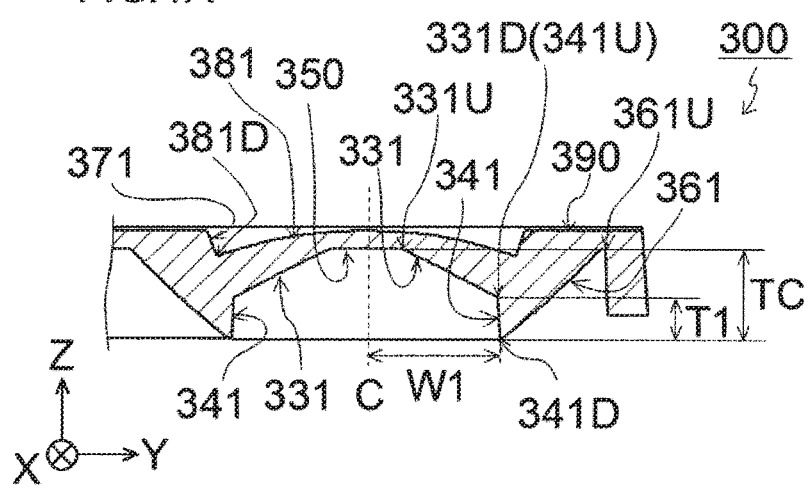

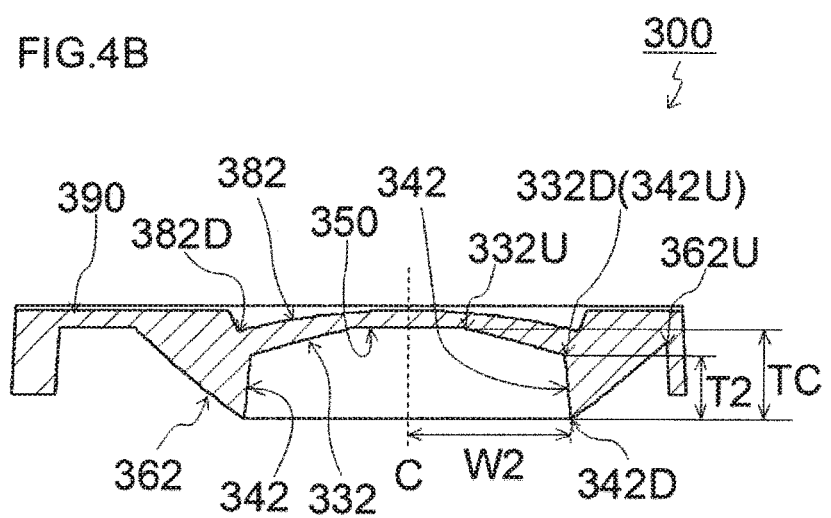

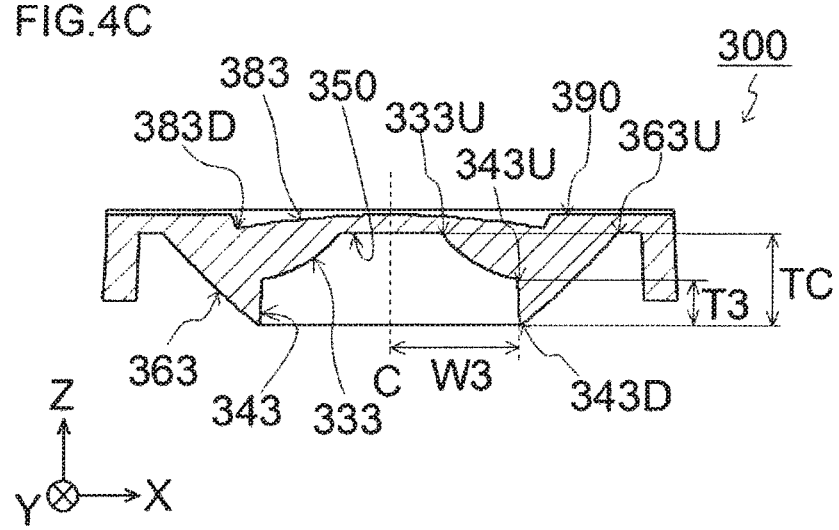

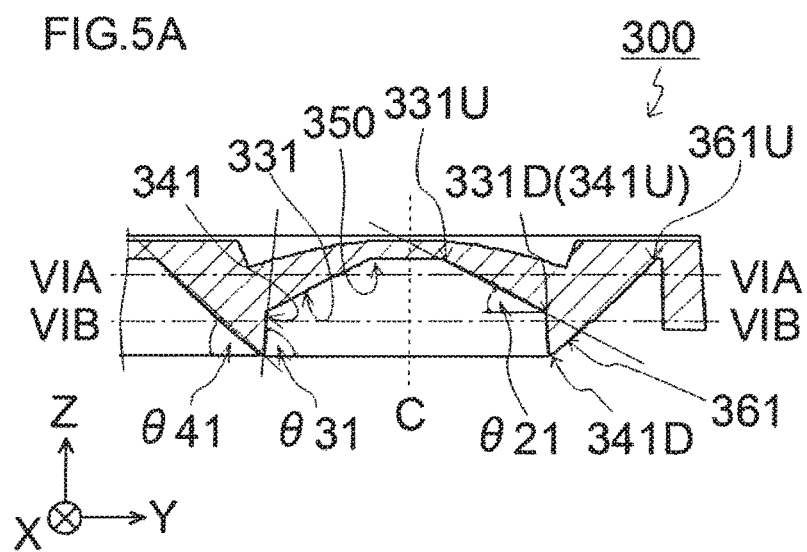

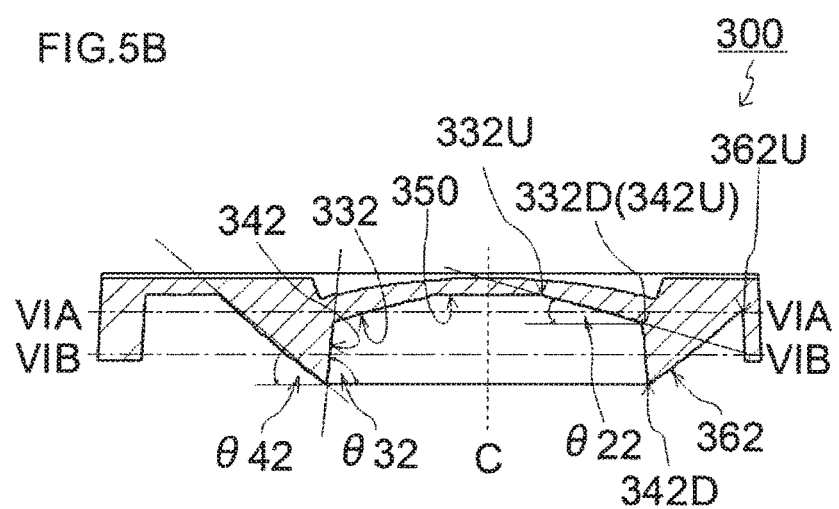

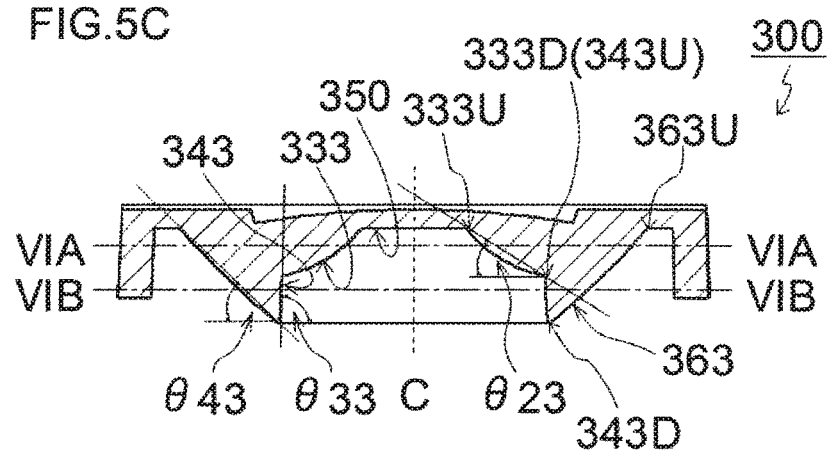

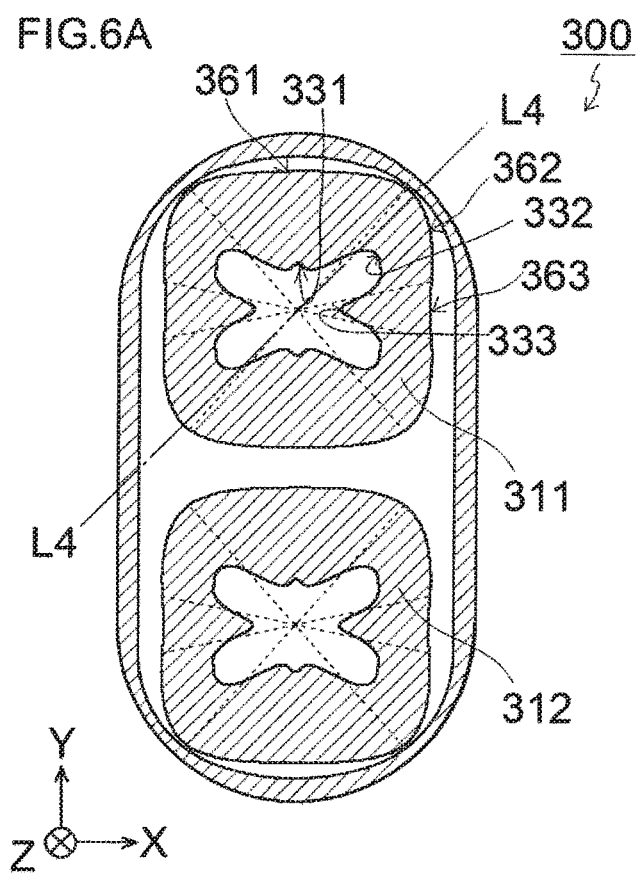

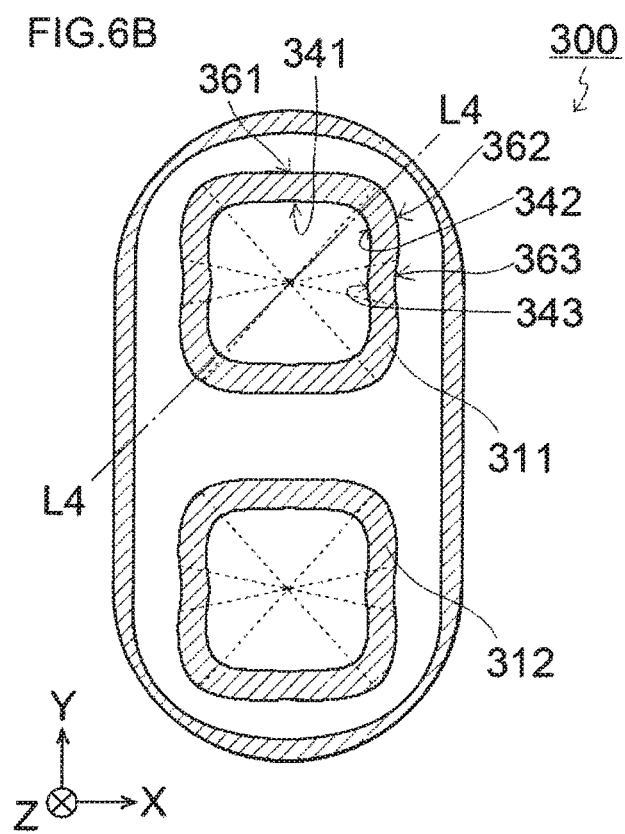

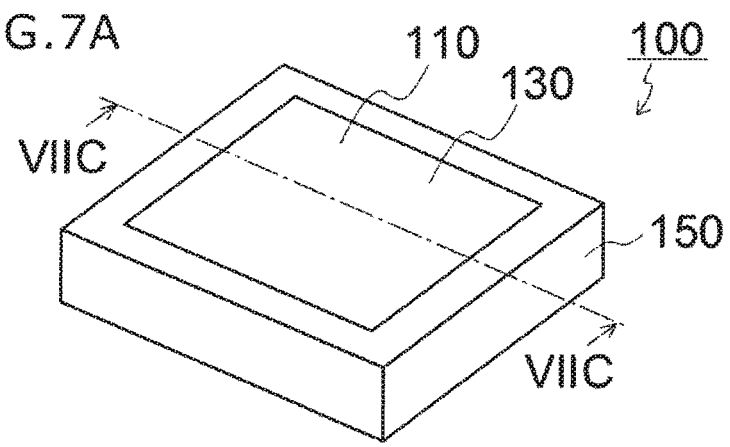

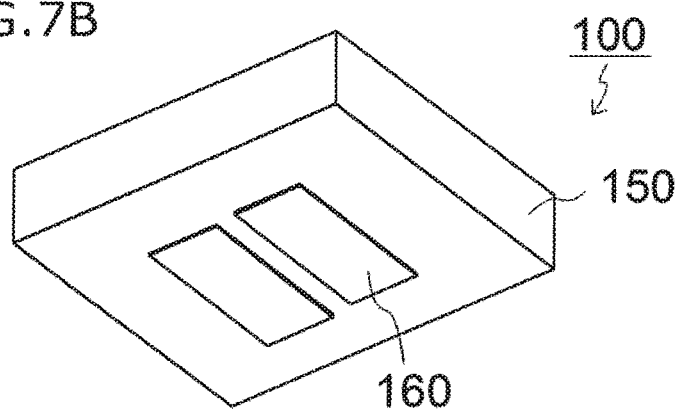

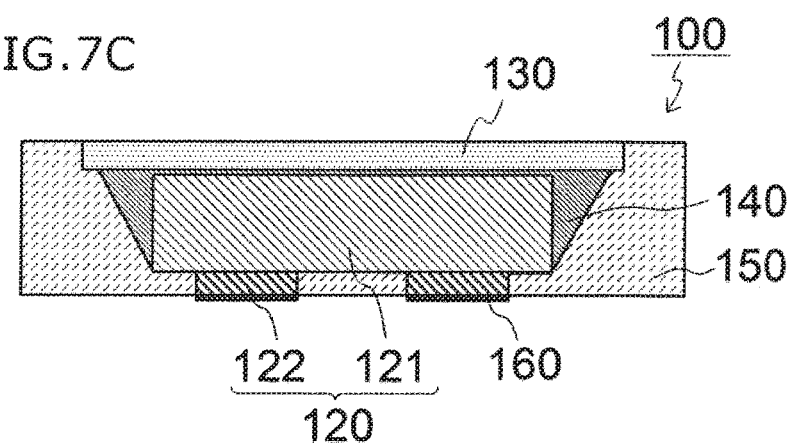

LIGHT SOURCE MODULE

CROSS-REFERENCE TO RELATED APPLICATIONS

This application claims priority to Japanese Patent Application No. 2018-104288, filed on May 31, 2018, the disclosure of which is hereby incorporated by reference in its entirety.

BACKGROUND

1. Technical Field

The present disclosure relates to a light source module.

2. Description of Related Art

There exist known light source modules that include a lens and the like for controlling the light distribution characteristic of light emitted from a light source such as an LED (Light Emitting Diode).

Such a light source module is, for example, installed in a smartphone for illumination during use of a camera. The imaging region of a camera is generally quadrangular and, therefore, there has been proposed a lens through which light from the light source module is emitted in a quadrangular shape (for example, JP 2014-209158 A).

There exists demand for means for evenly illuminating the imaging region of a camera.

SUMMARY

According to one embodiment, a light source module includes: a light source including, at its upper surface, a light emission surface; and a light guide member including a lens portion of which central axis is a center of the light emission surface. The lens portion includes: an incidence surface that is recessed and opposes to the light emission surface of the light source, light from the light source becoming incident on the incidence surface; a reflection surface disposed on a side outer than the incidence surface and reflects part of the light that is incident on the incidence surface to the outside; and an emitting surface emitting part of the light that is incident on the incidence surface and the light reflected at the reflection surface. The incidence surface includes an upper incidence region positioned on an upper side and a lower incidence region positioned lower than the upper incidence region in a cross section including the central axis. The lower incidence region has 2-fold rotational symmetry relative to the central axis. The lower incidence region includes a first lower incidence region and a second lower incidence region at a position rotated by 45 degrees from the first lower incidence region, and a height of the second lower incidence region is greater than a height of the first lower incidence region.

Thus, the light source module evenly illuminates the imaging region of a camera.

BRIEF DESCRIPTION OF THE DRAWINGS

FIG. 1A is a schematic plan view of an exemplary light source module according to an embodiment.
FIG. 1B is a schematic cross-sectional view taken along line IB-IB of the light source module shown in FIG. 1A.
FIG. 1C is a schematic cross-sectional view taken along line IC-IC of the light source module shown in FIG. 1A.
FIG. 1D is a schematic cross-sectional view taken along line ID-ID of the light source module shown in FIG. 1A.
FIG. 1E is a schematic cross-sectional view showing a variation of the light source module shown in FIG. 1B.
FIG. 1F is a schematic cross-sectional view showing a variation of the light source module shown in FIG. 1C.
FIG. 2A is a schematic perspective view showing an exemplary cover member according to an embodiment.
FIG. 2B is a schematic bottom view of a cover member shown in FIG. 2A.
FIG. 3 is a schematic bottom view showing an exemplary lens portion according to an embodiment.
FIG. 4A is a schematic cross-sectional view of the lens portion shown in FIG. 1B in an enlarged manner.
FIG. 4B is a schematic cross-sectional view of the lens portion shown in FIG. 1C in an enlarged manner.
FIG. 4C is a schematic cross-sectional view of the lens portion shown in FIG. 1D in an enlarged manner.
FIG. 5A is a schematic cross-sectional view of the lens portion shown in FIG. 1B in an enlarged manner.
FIG. 5B is a schematic cross-sectional view of the lens portion shown in FIG. 1C in an enlarged manner.
FIG. 5C is a schematic cross-sectional view of the lens portion shown in FIG. 1D in an enlarged manner.
FIG. 6A is a schematic end view of the schematic end view taken along line VIA-VIA of the lens portion shown in FIGS. 5A to 5C.
FIG. 6B is a schematic end view taken along line VIB-VIB of the lens portion shown in FIGS. 5A to 5C.
FIG. 7A is a schematic perspective view showing an exemplary light source according to an embodiment.
FIG. 7B is a schematic perspective view showing an exemplary light source according to an embodiment.
FIG. 7C is a schematic cross-sectional view taken along line VIIC-VIIC of the light source shown in FIG. 7A.

DETAILED DESCRIPTION

Figure 1G:
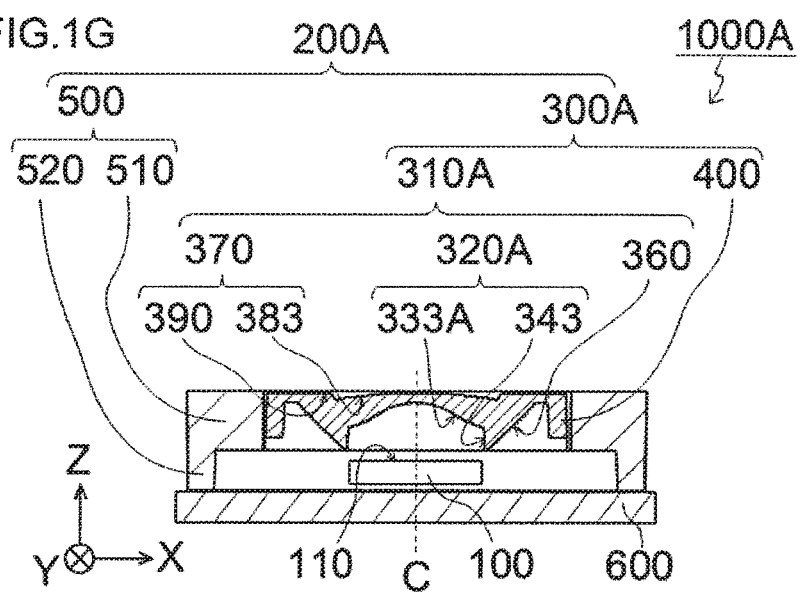
FIG. 1G is a schematic cross-sectional view showing a variation of the light source module shown in FIG. 1D.

Embodiments of the invention will be described below, with reference to the drawings. Note that the embodiments described below are merely illustrative, to show examples of the technical ideas of the present disclosure. The present invention is not limited to the embodiments described below. The dimension, material, shape, and relative disposition of the described elements are not intended to limit the scope of the present invention, and are merely illustrative. The size or positional relationship of members shown in the drawings may be exaggerated for the sake of clarity. Furthermore, some drawings may omit parts of elements for the sake of clarity.

In the following description, the direction parallel to the central axis C of the lens portion is defined as a top-bottom direction (the Z direction), in which the top direction is the +Z direction, and the bottom direction is the −Z direction. The light emission surface (the light extraction surface) of the light source module is positioned in the +Z direction. The description is given assuming that the XY plane is perpendicular to the Z direction and is defined by a lateral direction (the X direction) and a vertical direction (the Y direction) perpendicular to the lateral direction. As seen in a plan view as seen from the central axis C, the +X direction (the right direction) is referred to as the 0-degree direction, the +Y direction (the top direction) is referred to as the 90-degree direction, the −X direction (the left direction) is referred to as the 180-degree direction, and the −Y direction (bottom direction) is referred to as the 270-degree direction. In the cross section including the central axis C, the cross section positioned in the 0-degree direction and the 180-degree direction is referred to as the 0-degree section; the cross section positioned in the 45-degree direction, the 135-degree direction, the 225-degree direction, and the 315-degree direction is referred to as the 45-degree section; and the cross section positioned in the 90-degree direction and the 270-degree direction is referred to as the 90-degree section. The 0-degree section is the cross section including the X-axis, and the 90-degree section is the cross section including the Y-axis.

The angles respectively formed between surfaces of the lens portion (the incidence surface, the reflection surface, the emitting surface) and the horizontal plane (the XY plane) are referred to as respective inclination angles of the surfaces. Furthermore, when each of the surfaces is a curved surface in a cross section including the central axis C, a straight line connecting between its upper end its lower end is defined as a virtual plane. An angle formed between the virtual plane and the horizontal plane or the vertical plane is referred to as the inclination angle of the curved surface.

FIG. 1A is a schematic plan view showing an exemplary light source module 1000 according to the present embodiment. FIG. 1B is a schematic cross-sectional view (the 0-degree section) taken along line IB-IB in FIG. 1A. FIG. 1C is a schematic cross-sectional view (the 45-degree section) taken along line IC-IC in FIG. 1A. FIG. 1D is a schematic cross-sectional view (the 90-degree section) taken along line ID-ID in FIG. 1A. FIGS. 2A and 2B are respectively a bottom view and a perspective view showing a cover member 200, as seen from the incidence surface side, for the light source module 1000 shown in FIG. 1A and others. FIG. 3 is a bottom view of a light guide member 300 forming part of the cover member 200 as seen from the incidence surface side. FIGS. 4A and 5A are enlarged views showing part of FIG. 1B. FIGS. 4B and 5B are enlarged views showing part of FIG. 1C. FIGS. 4C and 5C are enlarged views showing part of FIG. 1D.

The light source module 1000 includes a light source 100, and a light guide member 300 disposed above the light source 100 (the +Z direction). The light source 100 includes a light emission surface 110 at its upper surface. The light guide member 300 includes a lens portion 310 that has the lens function for controlling light distribution. The lens portion 310 of the light guide member 300 is disposed to be positioned immediately above the light emission surface 110. The central axis C of the lens portion 310 is at the center of the light emission surface 110. The central axis C of the lens portion 310 is also the optical axis of the lens portion 310. In the example shown in FIG. 1A and others, the optical axis (the center) of the light source 100 and the central axis C of the lens portion 310 coincide with each other. Note that, the optical axis of the light source 100 and the central axis C of the lens portion 310 may not necessarily coincide with each other.

The lens portion 310 includes a recessed incidence surface 320 that opposes to the light emission surface 110 of the light source 100 and on which light from the light source 100 becomes incident. The lens portion 310 includes a reflection surface 360 disposed outside the incidence surface 320. The reflection surface 360 is the surface that reflects part of light that is incident on the incidence surface 320. The lens portion 310 further includes an emitting surface 370. The emitting surface 370 is the surface that emits part of light that is incident on the incidence surface 320 and light reflected at the reflection surface 360 to the outside.

The incidence surface 320 of the lens portion 310 includes, in the cross section including the central axis C, an upper incidence region 330 positioned on the upper side and a lower incidence region 340 positioned lower than the upper incidence region 330. The lower incidence region 340 has 2-fold rotational symmetry (referred to also as 180 degree-rotational symmetry, twice rotational symmetry) relative to the central axis C. In the plan view of FIG. 3, the lower incidence region 340 of the lens portion 310 has line symmetry (horizontal symmetry) relative to the X-axis, and has line symmetry (vertical symmetry) relative to the Y-axis.

FIG. 4A is a cross-sectional view in the 0-degree section, and includes a first lower incidence region 341. FIG. 4B is a cross-sectional view in the 45-degree section, and includes a second lower incidence region 342. FIG. 4C is a cross-sectional view in the 90-degree section, and includes a third lower incidence region 343. A height T2 of the second lower incidence region 342 is higher than a height T1 of the first lower incidence region 341. Note that, the term "height," as used herein, refers to the vertical distance between the lower end and the upper end of each lower incidence region.

In the lens portion 310 of the light guide member 300 of the light source module 1000 according to the present embodiment, the recessed incidence surface 320 on which light from the light source 100 becomes incident includes an upper incidence region 330 and a lower incidence region 340. The light that is incident on the upper incidence region 330 mainly propagates toward the emitting surface 370, and emitted in the direction including the central axis C of the lens portion 310, that is, above the light source 100. The light that is incident on the lower incidence region 340 mainly propagates toward the reflection surface 360, reflected at the reflection surface 360, and thereafter emitted from the emitting surface 370 in the direction spreading from the central axis C of the lens portion 310 (the outward direction). That is, the incidence surface 320 is divided into the upper and lower sides, so as to divide light into light to be emitted from the emitting surface 370 as it is and light to be emitted from the emitting surface 370 via the reflection surface 360. Thus, the entire emission light is controlled to achieve efficient even illumination of the imaging region.

Additionally, in the lower incidence region 340 positioned on the lower side, the height is changed between the first lower incidence region 341 positioned in the 90-degree direction and a second lower incidence region 342 positioned in the 45-degree direction rotated by 45 degrees from the 90-degree direction, so as to change the amount of light that is incident on those surfaces. In more detail, by the height T2 of the second lower incidence region 342 positioned in the 45-degree direction being higher than the height T1 of the first lower incidence region 341 positioned in the 90-degree direction, the amount of light that is incident on the second lower incidence region 342 becomes greater than the amount of light that is incident on the first lower incidence region 341. Therefore, the amount of light that is incident on the second lower incidence region 342, reflected at a second reflective region 362, and emitted from the emitting surface 370 is greater than the amount of light that is incident on the first lower incidence region 341, reflected at a first reflective region 361, and emitted from the emitting surface 370. Thus, the amount of light emitted in the 45-degree direction is greater than in the 90-degree direction, that is, the amount of light emitted in the corners of the imaging region is great.

The second lower incidence region 342 being disposed at the position rotated by 45 degrees from the first lower incidence region 341 means that each center line is disposed at the position rotated by 45 degrees about the central axis C. Specifically, at the position rotated by 45 degrees from the first center line L1 passing through the central axis C and dividing the first lower incidence region 341 into two equal halves, the second center line L2 passing through the central axis C and dividing the second lower incidence region 342 into two equal halves is positioned. Similarly, the third lower incidence region 343 being disposed at the position rotated by 90 degrees from the first lower incidence region 341 means that, at the position rotated by 90 degrees from the first center line L1 passing through the central axis C and dividing the first lower incidence region 341 into two equal halves, the second center line L3 passing through the central axis C and dividing the third lower incidence region 343 into two equal halves is positioned. In the present specification, unless otherwise specified, the description of the first lower incidence region 341, the second lower incidence region 342, and the third lower incidence region 343 is mainly the description of portions positioned on the first center line L1, the second center line L2, and the third center line L3. The same holds true for the upper incidence region, the reflection surface, and the emitting surface.

In using the light source module 1000 having such a light distribution characteristic as illumination during use of a camera, as compared to the amount of light spreading in the X direction (the 0-degree direction, the 180-degree direction) and the Y direction (the 90-degree direction, the 270-degree direction) about the central axis C toward the imaging region including the subject in the direction of the central axis C of the lens portion 310, that is, the amount of light including light that is incident on the first lower incidence region, the amount of light spreading in the four directions each rotated by 45 degrees therefrom, that is, the amount of light including light that is incident on the second lower incidence region increases. Because the imaging region of a camera is quadrangular, the lens and the light source module 1000 of the camera are disposed having the second lower incidence region positioned corresponding to the four corners of that quadrangle. Thus, the amount of light emitted toward the four corners increases. This provides even light that illuminates the quadrangle imaging region.

In the following, a description will be given of the structures of the light source module according to the embodiment.

<Cover Member>

FIGS. 2A and 2B are respectively a bottom view and a perspective view of the cover member 200, as seen from the incidence surface side, for the light source module 1000 shown in FIG. 1A and others. The cover member 200 includes the light guide member 300 including the lens portion 310 that contributes to controlling the light distribution characteristic, and the supporting member 500 disposed around the light guide member 300 for supporting the light guide member 300.

The cover member 200 is provided so as to cover the light source 100. Space is defined by the surrounding wiring board 600 and the cover member 200, in which space the light source 100 is disposed. Note that, in addition to the light source 100, a protective element such as a Zener diode (ZD) or a transient voltage suppressor (TVS), or any electronic components such as optical sensors for luminance, chromaticity, infrared and the like may be disposed in the same space.

The cover member 200 includes one or a plurality of light guide member(s) 300, and one or a plurality of supporting member(s) 500 supporting the light guide member(s) 300. Here, what is exemplarily shown is the cover member 200 in which one supporting member 500 supports one light guide member 300.

[Light Guide Member]

FIG. 3 is a bottom view of the light guide member 300 forming part of the cover member 200 as seen from the incidence surface side. The light guide member 300 includes the lens portion 310 that has the lens function for controlling light distribution of light emitted from the light emission surface 110 of the light source 100, and a flange part 400 that holds the lens portion 310. The light guide member 300 is formed of a material capable of transmitting light from the light source 100. The lens portion 310 and the flange part 400 are integrally molded. The light guide member 300 may be formed of a light-transmissive material such as polycarbonate, acrylic resin, silicone resin, epoxy resin or the like. As used herein, being transmissive refers to exhibiting the function of transmitting light from the light source 100 by 50% or more, preferably 80% or more, and further preferably 90% or more.

The light guide member 300 may include one or a plurality of lens portions 310. FIG. 3 shows an exemplary light guide member 300 including a first lens portion 311 and a second lens portion 312 as two lens portions 310. Note that, the matters common to the first lens portion 311 and the second lens portion 312 are explained without differentiating between them and collectively as the lens portion 310.

In the case in which one light guide member 300 includes two or more lens portions 310, the lens portions 310 may be integrally molded via the flange part 400 disposed between the lens portions 310. Alternatively, a plurality of light guide members each including one lens portion may be provided.

(Lens Portion)

The lens portion 310 controls distribution of light emitted from the light source 100. The lens portion 310 includes the incidence surface 320 that mainly forms the lower surface, the reflection surface 360 that mainly forms the lateral surface, and the emitting surface 370 that mainly forms the upper surface. The lens portion 310 includes the central axis C at the center of the light emission surface 110 of the light source 100. In the case in which the light guide member 300 includes a plurality of lens portions 310, for example, as shown in FIG. 1B, in the case in which the light guide member 300 includes the first lens portion 311 and the second lens portion 312, the lens portions each include the central axis C, and the central axis C is disposed at the center of the light emission surface 110 of corresponding light source 100. The incidence surface 320 and the emitting surface 370 of the lens portion 310 are disposed at positions including the central axis C. The reflection surface 360 is disposed at a position spaced apart from the central axis C.

(Incidence Surface of Lens Portion)

Firstly, a description will be given of the incidence surface 320. The incidence surface 320 is the surface on which light from the light source 100 becomes incident, and opposes to the light emission surface 110 of the light source 100 via the air layer. The incidence surface 320 is recessed as a whole on the lower surface side of the lens portion 310. In other words, the incidence surface 320 of the lens portion 310 is the inner surface of the recess that opens on the lower side of the lens portion 310. The dimension of the opening (the diameter of the opening) at the lower end of the incidence surface 320 is similar to the area of the light emission surface 110 of the light source 100. Thus, light emitted from the light emission surface 110 efficiently becomes incident on the incidence surface 320. Note that, the lower end of the incidence surface 320 is preferably positioned on an identical plane over the entire circumference.

The portion positioned on the central axis C of the lens portion 310 is the center of the incidence surface 320. As shown in FIG. 1B and others, the center of the incidence surface 320 is arranged at the highest position in the +Z direction. The incidence surface 320 includes the upper incidence region 330 and the lower incidence region 340 in any cross section including the central axis C.

As seen in a plan view, the upper incidence region 330 is positioned on the inner side, and the lower incidence region 340 is positioned on the side outer than the upper incidence region 330. That is, the upper incidence region 330 can be referred to also as the inner incidence region, and the lower incidence region 340 can be referred to also as the outer incidence region.

In the cross section including the central axis C, the upper incidence region 330 and the lower incidence region 340 are different from each other in inclination angle. In more detail, in the cross section including the central axis C, an angle formed between the lower incidence region 340 and the horizontal plane (the XY plane) is greater than an angle formed between the upper incidence region 330 and the horizontal plane. Thus, light that is incident on the lower incidence region 340 tends to propagate in the lateral direction (the X direction).

The boundary between the upper incidence region 330 and the lower incidence region 340 may be obvious, or the upper incidence region 330 and the lower incidence region 340 may change their shape smoothly at their boundary. Such a boundary may be the lower end of the upper incidence region 330, or the upper end of the lower incidence region 340. Furthermore, the upper end of the upper incidence region 330 may be the upper end of the incidence surface 320, or the lower end of the lower incidence region 340 may be the lower end of the incidence surface 320. In the case in which the upper incidence region 330 and the lower incidence region 340 change their shape smoothly at their boundary, such a boundary can be regarded as belonging to none of the upper incidence region 330 and the lower incidence region 340, and the present embodiment may include such a boundary. Note that, the boundary between the upper incidence region 330 and the lower incidence region 340 may be obviously visually recognizable.

(Incidence Surface of Lens Portion: Lower Incidence Region)

The lower incidence region 340 has 2-fold rotational symmetry relative to the central axis C. A shape having 2-fold rotational symmetry recovers its original shape when rotated by 180 degrees about the central axis C. In other words, as seen in a plan view, the lower incidence region 340 has vertical symmetry and horizontal symmetry.

The lower incidence region 340 includes a first lower incidence region 341, and a second lower incidence region 342 disposed at the position rotated by 45 degrees from the first lower incidence region 341. The lower incidence region 340 further includes a third lower incidence region 343 at the position rotated by 90 degrees from the first lower incidence region 341. For example, as shown in FIG. 3 and others, the first lower incidence region 341 is positioned in the 90-degree section, and the second lower incidence region 342 is positioned in the 45-degree section. The third lower incidence region 343 is positioned in the 0-degree section. The height T2 of the second lower incidence region 342 is higher than the height T1 of the first lower incidence region 341. For example, T2 may be 100% to 200%, preferably 150% to 200%, as great as T1. As has been described above, because the lower end of the incidence surface 320 is positioned on the identical plane, the height T2 of the second lower incidence region 342 being higher means that the second lower incidence region 342 is longer in the +Z direction than the first lower incidence region 341.

The first lower incidence region 341 and the second lower incidence region 342 preferably change their shape smoothly at their boundary. As shown in FIG. 3, the regions may be partitioned from each other by a boundary Ld1 represented by the broken line radially extending about the central axis C. Note that, when the shape smoothly changes, the boundary Ld1 may not be visually recognized.

The third lower incidence region 343 and the second lower incidence region 342 also preferably change their shape smoothly at their boundary. As shown in FIG. 3, the regions may be partitioned from each other by a boundary Ld2 represented by the broken line radially extending about the central axis C. Note that, when the shape smoothly changes, the boundary Ld2 may not be visually recognizable.

As shown in FIG. 3, the first lower incidence region 341 and the second lower incidence region 342 respectively have predetermined central angles $\theta 11$, $\theta 12$. The central angle $\theta 11$ is preferably greater than the central angle $\theta 12$. Thus, the amount of light increases in the 45-degree direction than in the 90-degree direction. The central angle $\theta 11$ preferably falls within a range of 40 degrees to 88 degrees inclusive, and further preferably 60 degrees to 85 degrees inclusive. As shown in FIG. 3, boundary Ld1 is disposed in close proximity to a straight line L4 representing the position rotated by 45 degrees from the center line L1 coincident with the Y-axis (hereinafter referred to as the 45-degree line L4). The central angle $\theta 12$ of the second lower incidence region 342 preferably falls within a range of 10 degrees to 45 degrees inclusive, and further preferably 15 degrees to 30 degrees inclusive.

As shown in FIG. 3, the third lower incidence region 343 includes a central angle $\theta 13$. The central angle $\theta 13$ is preferably smaller than the central angles $\theta 11$ and $\theta 12$. This causes light in the 0-degree direction to advance in the 45-degree direction. The central angle $\theta 13$ falls within a range of, for example, preferably 5 degrees to 40 degrees inclusive, and further preferably 10 degrees to 30 degrees inclusive.

(First Lower Incidence Region of Incidence Surface)

As shown in FIG. 3, the first lower incidence regions 341 are two regions disposed having the central axis C interposed between them in the cross section (the 90-degree section) including the Y-axis passing through the central axis C as seen in a plan view. The first lower incidence regions 341 have line symmetry (vertical symmetry) relative to the Y-axis. The two first lower incidence regions 341 disposed having the X-axis interposed between them have line symmetry (horizontal symmetry) relative to the X-axis. The first center line L1 equally dividing the first lower incidence regions 341 coincides with the Y-axis. Each of the first lower incidence regions 341 is interposed between the second lower incidence regions 342 positioned on its right and left sides.

Each first lower incidence region 341 is preferably 20% to 60% as high as the height TC of the center of the incidence surface 320 in the 90-degree section. In the example shown in FIG. 4A, the first lower incidence region 341 is 30% to 40% as high as the height TC. The proportion of the first lower incidence region 341 occupying in the 90-degree section can be selected as appropriate according to the thickness of the lens portion or the size of the light source.

An upper end 341U of the first lower incidence region 341 is preferably at a position lower than an upper end 361U of the reflection surface 360 (the first reflective region 361). Thus, most of light that is incident on the first lower incidence region 341 is reflected at the reflection surface 360. That is, the light incident on the first lower incidence region 341 becomes less prone to be directly emitted from the emitting surface 370.

The first lower incidence region 341 may be a concave curved surface in the 90-degree section. Thus, the refracting angle of light that is incident on the lower end of the first lower incidence region 341 coincides with that of light that is incident on the upper end of the first lower incidence region 341. The curvature with the concave curved surface preferably falls within a range of 1 mm to 20 mm inclusive. The first lower incidence region 341 may be a flat surface.

The angle formed between the first lower incidence region 341 and the horizontal plane (the inclination angle θ31 of the first lower incidence region) preferably falls within a range of 70 degrees to 90 degrees inclusive, further preferably 80 degrees to 87 degrees inclusive. This increases the amount of light that is incident on the reflection surface 360.

A distance W1 between the lower end 341D of the first lower incidence region 341 and the central axis C is preferably smaller than a distance W2 between the lower end 342D of the second lower incidence region 342 and the central axis C. This causes light in the 45-degree direction from the light source to be collected into the lens without any loss. While the distances W1 and W2 show the distance at each lower end in FIGS. 4A and 4B, the distance W1 is preferably smaller than the distance W2 in any horizontal plane perpendicular to the central axis C.

FIG. 6A is a schematic end view taken along line VIA-VIA in FIGS. 5A to 5C. FIG. 6B is a schematic end view taken along line VIB-VIB in FIGS. 5A to 5C. FIG. 6A is a schematic end view including the upper incidence region 330. FIG. 6B is a schematic end view including the lower incidence region 340. FIG. 6A will be referred to later.

(Second Lower Incidence Region of Incidence Surface)

As shown in FIG. 3, the second lower incidence regions 342 are four regions disposed on the right and left sides of the first lower incidence regions 341 as seen in a plan view. The center line L2 including the central axis C and equally dividing the central angle θ12 for each of two second lower incidence regions 342 disposed symmetrically relative to the central axis C is at a position displaced in the 0-degree direction from the 45-degree line L4. Two second lower incidence regions 342 disposed on the right side and two second lower incidence regions 342 disposed on the left side with reference to the Y-axis (L1) have line symmetry (vertical symmetry) relative to the Y-axis (L1). Similarly, two second lower incidence regions 342 disposed on the upper side and two second lower incidence regions 342 disposed on the lower side with reference to the X-axis (L3) have line symmetry (horizontal symmetry) relative to the X-axis (L3). The second lower incidence regions 342 are not symmetric but asymmetric relative to the center line L2.

As shown in FIG. 4B, the second lower incidence region 342 is preferably 40% to 80%, further preferably 60% to 80%, as high as the height TC of the center of the incidence surface 320 in the 45-degree section. That is, the second lower incidence region 342 occupies a greater proportion in the 45-degree section than the second upper incidence region 332. This increases the amount of light illuminating the corners of the quadrangular imaging region.

An upper end 342U of the second lower incidence region 342 is preferably at a position lower than the upper end 362U of the reflection surface 360 (the second reflective region 362). Thus, most of light that is incident on the second lower incidence region 342 is reflected at the reflection surface 360. That is, the light incident on the second lower incidence region 342 becomes less prone to be directly emitted from the emitting surface 370.

The second lower incidence region 342 is preferably a concave curved surface in the 45-degree section. Thus, the refracting angle of light that is incident on the lower end of the second lower incidence region 342 coincides with that of light that is incident on the upper end of the second lower incidence region 342. The curvature with the convex curved surface preferably falls within a range of 1 mm to 20 mm inclusive. The second lower incidence region 342 may be a flat surface.

The angle formed between the second lower incidence region 342 and the horizontal plane (the inclination angle θ32 of the second lower incidence region) preferably falls within a range of 70 degrees to 90 degrees inclusive, further preferably 80 degrees to 87 degrees inclusive. This increases the amount of light that is incident on the reflection surface 362.

(Third Lower Incidence Region of Incidence Surface)

As shown in FIG. 3, the third lower incidence regions 343 are two regions disposed in the cross section (0-degree section) including the X-axis passing through the central axis C as seen in a plan view. The third lower incidence regions 343 have line symmetry (horizontal symmetry) relative to the X-axis. The two third lower incidence regions 343 disposed having the Y-axis interposed between them have line symmetry (vertical symmetry) relative to the Y-axis. The first center line L3 equally dividing the third lower incidence regions 343 coincides with the X-axis. Each of the third lower incidence regions 343 is interposed between the second lower incidence regions 342 positioned on its upper and lower sides.

Each first lower incidence region 343 is preferably 20% to 60% as high as the height TC of the center of the incidence surface 320 in the 0-degree section. In the example shown in FIG. 4C, the first lower incidence region 343 is 30% to 40% as high as the height TC.

An upper end 343U of the third lower incidence region 343 is preferably at a position lower than an upper end 363U of the reflection surface 360 (a third reflective region 363). Thus, most of light that is incident on the third lower incidence region 343 is reflected at the reflection surface 360. That is, the light incident on the third lower incidence region 343 becomes less prone to be directly emitted from the emitting surface 370.

The third lower incidence region 343 may be a concave curved surface in the 0-degree section. Thus, the refracting angle of light that is incident on the lower end of the third lower incidence region 343 coincides with that of light that is incident on the upper end. The curvature with the concave curved surface preferably falls within a range of 1 mm to 20 mm inclusive. The third lower incidence region 343 may be a flat surface in the 0-degree section.

The angle formed between the third lower incidence region 343 and the horizontal plane (the inclination angle θ33 of the third lower incidence region) preferably falls within a range of 70 degrees to 90 degrees inclusive, further preferably 80 degrees to 87 degrees inclusive. This increases the amount of light that is incident on the reflection surface 360.

A distance W3 between the lower end 343D of the third lower incidence region 343 and the central axis C is preferably smaller than the distance W2 between the lower end 342D of the second lower incidence region 342 and the central axis C. This causes light in the 45-degree direction from the light source to be collected into the lens without any loss. While the distances W2 and W3 show the distance at each lower end in FIGS. 4B and 4C, the distance W3 is preferably smaller than the distance W2 in any horizontal plane perpendicular to the central axis C.

incidence region FIG. 6B is a schematic end view including the lower incidence region 340. Firstly, a description will be given of the lower incidence region 340. FIG. 6A will be referred to later.

(Incidence Surface: Upper Incidence Region)

The incidence surface 320 includes the upper incidence region 330 between the lower incidence region 340 and the central axis C. Similarly to the lower incidence region 340, the upper incidence region 330 has 2-fold rotational symmetry relative to the central axis C. In more detail, the first upper incidence region 331 is positioned between the first lower incidence region 341 and the central axis C. The second upper incidence region 332 is positioned between the second lower incidence region 342 and the central axis C. The third upper incidence region 333 is positioned between the third lower incidence region 343 and the central axis C.

As shown in FIG. 3 and others, the first upper incidence region 331 is positioned in the 90-degree section, and the second upper incidence region 332 is positioned in the 45-degree section. The third upper incidence region 333 is positioned in the 0-degree section.

The first upper incidence region 331 and the second upper incidence region 332, and the second upper incidence region 332 and the third upper incidence region 333 preferably change their shape smoothly at their boundary, similarly to the interface of each incidence region in the lower incidence region 340.

The first upper incidence region 331 to the third upper incidence region 333 preferably respectively include central angles θ11 to θ13, similarly to the first lower incidence region 341 to the third lower incidence region 343.

As shown in these drawings, by virtue of the first upper incidence region 331, the second upper incidence region 332, and the third upper incidence region 333 having 2-fold rotational symmetry, T2 being greater than T1, and T2 being greater than T3, a greater amount of light in the 45-degree direction (light propagating toward the corners of the quadrangular imaging region) is emitted.

(First Upper Incidence Region of Incidence Surface)

As shown in FIG. 3, the first upper incidence regions 331 are two regions disposed having the central axis C interposed between them at the position including the Y-axis passing through the central axis C as seen in a plan view. The first upper incidence regions 331 have line symmetry (vertical symmetry) relative to the Y-axis. The two first upper incidence regions 331 disposed having the X-axis interposed between them have line symmetry (horizontal symmetry) relative to the X-axis. The first center line L1 equally dividing the first upper incidence regions 331 coincides with the Y-axis. Each of the first upper incidence regions 331 is interposed between the second upper incidence region 332 positioned on its right and left sides.

A lower end 331D of each first upper incidence region 331 is preferably at a position lower than the upper end 361U of the reflection surface 360 (the first reflective region 361). Thus, light refracted at the first lower incidence region 341 is reflected at the reflection surface 360 without being directly emitted from the outer emitting region 390. The upper end 331U of the first upper incidence region 331 is preferably at a position higher than the upper end 361U of the first reflective region 361. This improves flowability of the resin material in molding, and improves moldability.

As shown in FIG. 4A and others, the first upper incidence region 331 may be a surface that is substantially a flat surface in the cross section including the central axis C (the 90-degree section). In more detail, the first upper incidence region 331 is positioned on the inner side (the side nearer to the central axis C) than the straight line connecting between the upper end 331U of the first upper incidence region 331 and the lower end 331D. The curvature with the convex curved surface may fall within a range of 1 mm to 20 mm inclusive.

The angle formed between the first upper incidence region 331 and the horizontal plane (the inclination angle θ21 of the first upper incidence region 331) preferably falls within a range of 10 degrees to 40 degrees inclusive, further preferably 15 degrees to 30 degrees inclusive. The inclination angle θ21 of the first upper incidence region 331 is preferably greater than the angle formed between the second upper incidence region 332 and the horizontal plane (the inclination angle θ22 of the second upper incidence region 332). Thus, T2 becomes greater than T1, and the amount of light illuminating the end of the imaging region increases.

(Second Upper Incidence Region of Incidence Surface)

As shown in FIG. 3, the second upper incidence regions 332 are four regions disposed on the right and left sides of the first upper incidence region 331 as seen in a plan view. The center line L2 including the central axis C and equally dividing the central angle θ12 for each of two second upper incidence regions 332 disposed symmetrically relative to the central axis C is at a position displaced in the 0-degree direction from 45-degree line L4. Two second upper incidence regions 332 disposed on the right side and two second upper incidence regions 332 disposed on the left side with reference to the Y-axis (L1) have line symmetry (vertical symmetry) relative to the Y-axis (L1). Similarly, two second upper incidence regions 332 disposed on the upper side and two second upper incidence regions 332 disposed on the lower side with reference to the X-axis (L3) have line symmetry (horizontal symmetry) relative to the X-axis (L3). The second upper incidence regions 332 are not symmetric but asymmetric relative to the center line L2.

An upper end 332U of the second upper incidence region 332 is preferably at a position higher than the upper end 362U of the reflection surface 360 (the second reflective region 362). This improves flowability of the resin in molding, and improves moldability.

As shown in FIG. 4B and others, the second upper incidence region 332 may be a flat surface or a concave curved surface approximating a flat surface in the cross section including the central axis C (the 45-degree section).

The angle formed between the second upper incidence region 332 and the horizontal plane (the inclination angle θ22 of the second upper incidence region 332) preferably falls within a range of 10 degrees to 40 degrees inclusive, further preferably 15 degrees to 30 degrees inclusive. The inclination angle θ22 of the second upper incidence region 332 is preferably smaller than the inclination angle θ21 of the first upper incidence region 331. Thus, T2 becomes greater than T1, and the amount of light illuminating the end of the imaging region increases.

(Third Upper Incidence Region of Incidence Surface)

As shown in FIG. 3, the third upper incidence regions 333 are two regions disposed in the cross section (0-degree section) including the X-axis passing through the central axis C as seen in a plan view. The third upper incidence regions 333 have line symmetry (horizontal symmetry)

relative to the X-axis. Two third upper incidence regions 333 disposed having the Y-axis interposed between them have line symmetry (vertical symmetry) relative to the Y-axis. The first center line L3 equally dividing the third upper incidence regions 333 coincides with the X-axis. Each of the third upper incidence regions 333 is interposed between the second upper incidence regions 332 positioned on its upper and lower sides.

An upper end 333U of the third upper incidence region 333 is preferably at a position lower than an upper end 363U of the reflection surface 360 (the third reflective region 363). This improves flowability of the resin in molding, and improves moldability.

The angle formed between the third upper incidence region 333 and the horizontal plane (the inclination angle θ23 of the third upper incidence region 333) preferably falls within a range of 20 degrees to 45 degrees inclusive, further preferably 25 degrees to 40 degrees inclusive. The inclination angle θ23 of the third upper incidence region 333 is preferably greater than the inclination angle θ2 of the second upper incidence region 332. Thus, T2 becomes greater than T3, and the amount of light illuminating the end of the imaging region increases.

A distance W3 between the lower end 333D of the third upper incidence region 333 and the central axis C is preferably smaller than the distance W2 between the lower end 342D of the second lower incidence region 342 and the central axis C. This increases the amount of light illuminating the end of the imaging region. While the distances W2 and W3 show the distance at each lower end in FIGS. 4B and 4C, the distance W3 is preferably smaller than the distance W2 in any horizontal plane perpendicular to the central axis C.

(Fourth Incidence Region of Incidence Surface)

As shown in FIG. 1B and others, the incidence surface 320 positioned on the central axis C may include a fourth incidence region 350, which is a flat surface, in the horizontal plane (the XY plane) perpendicular to the central axis C. The fourth incidence region 350 is a region surrounded by two first upper incidence regions 331, four second upper incidence regions 332, and two third upper incidence regions 333.

Provision of such a fourth incidence region 350 minimizes a reduction in strength of the light guide member 300. The light guide member 300 that includes the recessed incidence surface 320 is thinnest at the portion positioned on the central axis C. Accordingly, provision of the flat-surface fourth incidence region 350 at the portion positioned on the central axis C increases the thickness of the light guide member 300 thereby minimizing a reduction in strength of the light guide member 300. Furthermore, in forming the light guide member 300, for example, in injecting liquid resin into a mold assembly, the mold assembly having a flat surface at the region corresponding to the fourth incidence region 350 can secure a wider space between the lower surface and the upper surface. This minimizes obstruction for the resin flow and improves flowability of resin in the mold assembly. The fourth incidence region 350 may be 0% to 70% as great as the opening of the incidence surface 320. The luminance immediately above can be controlled by the size of the fourth incidence region 350.

When the flat-surface fourth incidence region 350 is provided, as shown in FIG. 2B, the outer edge thereof is obvious. In other words, the boundary between the upper incidence region 330 (the first upper incidence region 331, the second upper incidence region 332, the third upper incidence region 333) and the fourth incidence region 350 is obvious. Note that, the boundary between the upper incidence region 330 and the fourth incidence region 350 may not be obvious because of the upper incidence region 330 and the fourth incidence region 350 changing their shape smoothly.

A light source module 1000A shown in FIGS. 1E to 1G is a variation of the light source module 1000 shown in FIGS. 1A to 1D. In more detail, a cover member 200A in the light source module 1000A is different in including, as a light guide member 300A, a lens portion 310A that does not include the fourth incidence region at an incidence surface 320A including the central axis C. The incidence surface 320A of the lens portion 310A includes a first upper incidence region 331A, a second upper incidence region 332A, and a third upper incidence region 333A that are each a concave curved surface highest at the portion positioned on the central axis C in the cross section including the central axis C. In this manner, by the lens portion 310A dispensing with the horizontal surface perpendicular to the central axis C, the light distribution angle of light emitted in the central axis C widens, minimizing an increase in luminance at the center than the other part in the imaging region. Thus, light is evenly emitted in the imaging region.

(Reflection Surface of Lens Portion)

The reflection surface 360 of the lens portion 310 is disposed at the lateral surface of the lens portion 310. The reflection surface 360 is the surface that reflects mainly light that is incident on the lower incidence region 340 of the incidence surface 320. As shown in FIGS. 4A, 4B and others, the reflection surface 360 is an inclined surface in which the upper end of the reflection surface 360 is positioned on the outer side (far side from the central axis C) than the lower end of the reflection surface 360 in the cross section including the central axis C. Because the upper end of the reflection surface 360 is positioned outer than the lower end thereof, as shown in the bottom view of FIG. 3, the reflection surface 360 is visually recognized to surround the outer periphery of the incidence surface 320.

The reflection surface 360 may have 2-fold rotational symmetry or 4-fold rotational symmetry relative to the central axis C. Alternatively, the reflection surface 360 may be circular about the central axis C. In the example shown in FIG. 3, the reflection surface 360 has 2-fold rotational symmetry relative to the central axis C. In more detail, the reflection surface 360 includes the first reflective region 361 positioned in the 0-degree section including the central axis C, the second reflective region 362 positioned in the 45-degree section including the central axis C, and the third reflective region 363 positioned in the 90-degree section including the central axis C.

For example, as shown in FIG. 3, the reflection surface 360 includes the first reflective region 361, which is a convex curved surface as seen in a bottom view, on the outer side relative to the first lower incidence region 341. The reflection surface 360 further includes the second reflective region 362, which is a concave curved surface as seen in a bottom view, on the outer side relative to the second lower incidence region 342. The reflection surface 360 further includes the third reflective region 363, which is a convex curved surface as seen in a bottom view, on the outer side relative to the third lower incidence region 343.

In the case in which the reflection surface 360 has 2-fold rotational symmetry and includes the first reflective region 361 positioned in the 90-degree section, the second reflective region 362 positioned in the 45-degree section, and the third reflective region positioned in the 0-degree section, their formation ranges, proportions, central angles and the like are adjusted so as to respectively correspond to the first lower incidence region 341, the second lower incidence region 342, and the third lower incidence region 343 each having 2-fold rotational symmetry. The first reflective region 361, the second reflective region 362, the third reflective region 363 may change their shape gradually at their boundaries. In such a case, the boundaries may not be obviously visually recognizable.

As shown in FIG. 5A, the angle (the inclination angle θ41 of the first reflective region 361) formed between the straight line connecting the upper end 361U of first reflective region 361 and the lower end thereof (the lower end of the first lower incidence region) to each other and the horizontal plane may fall within a range of 20 degrees to 50 degrees inclusive. As shown in FIG. 5B, the angle (the inclination angle of the second reflective region 362) θ42 formed between the straight line connecting the upper end 362U of the second reflective region 362 and the lower end thereof (the lower end of the second lower incidence region) to each other and the horizontal plane may fall within a range of 20 degrees to 50 degrees inclusive. As shown in FIG. 5C, the angle (the inclination angle θ43 of the third reflective region 363) formed between the straight line connecting the upper end 363U of the third reflective region 363 and the lower end thereof (the lower end of the third lower incidence region) to each other and the horizontal plane may fall within a range of 20 degrees to 50 degrees inclusive. The inclination angle θ42 of the second reflective region 362 is preferably greater than the angle θ41 of the first reflective region 361. Thus, light that is incident on the second lower incidence region 342 is reflected at the second reflective region 362 to the outside by a wider light distribution angle.

(Emitting Surface of Lens Portion)

Next, a description will be given of the emitting surface 370. The emitting surface 370 of the lens portion 310 is disposed at the upper surface of the lens portion 310. The emitting surface 370 is the surface that emits light from the light source to the outside. The emitting surface 370 includes an inner emitting region 380 positioned at the center including the central axis C, and an outer emitting region 390 positioned along the outer periphery of the inner emitting region 380. The inner emitting region 380 is the convex curved surface that is convex in the +Z direction, and the outer emitting region 390 is a plane perpendicular to the central axis C.

The inner emitting region 380 and the outer emitting region 390 may be continuous to each other. Alternatively, as shown in FIGS. 4A to 4C and others, an inward surface 371 may be provided between the inner emitting region 380 and the outer emitting region 390. The inward surface 371 is a surface being continuous to the inner end of the outer emitting region 390 and to the outer end of the inner emitting region 380.

(Inner Emitting Region of Emitting Surface)

The inner emitting region 380 of the emitting surface 370 is the surface that emits mainly light that is incident on the upper incidence region 330 to the outside. The inner emitting region 380 may have 2-fold rotational symmetry or 4-fold rotational symmetry relative to the central axis C. The inner emitting region 380 may be a body of revolution. Hereinafter, a description will be given of the inner emitting region 380 having 2-fold rotational symmetry. The inner emitting region 380 includes a first inner emitting region 381 positioned in the 90-degree section, a second inner emitting region 382 positioned in the 45-degree section, and a third inner emitting region 383 positioned in the 0-degree section. The first inner emitting region 381 is positioned above the first upper incidence region 331. The second inner emitting region 382 is positioned above the second upper incidence region 332. The third inner emitting region 383 is positioned above the third upper incidence region 333.

The first inner emitting region 381, the second inner emitting region 382, and the third inner emitting region 383 preferably change their shape smoothly at their boundaries. As shown in FIG. 1A, these regions may be partitioned by the boundaries represented by broken lines radially extending about the central axis C. Note that, when the shape smoothly changes, the boundaries may not be visually recognizable. The central angles of the first inner emitting region, the second inner emitting region, and the third inner emitting region are preferably respectively identical to the central angle θ11 of the first upper incidence region 331, the central angle θ12 of the second upper incidence region 332, and the central angle θ13 of the third upper incidence region 333.

(First Inner Emitting Region of Inner Emitting Region)

As shown in FIG. 1A, the first inner emitting regions 381 are two regions disposed having the central axis C interposed between them in the cross section (the 90-degree section) including the Y-axis passing through the central axis C as seen in a plan view. The first inner emitting regions 381 have line symmetry (vertical symmetry) relative to the Y-axis. The two first inner emitting regions 381 disposed having the X-axis interposed between them have line symmetry (horizontal symmetry) relative to the X-axis. The center line equally dividing the first inner emitting regions 381 coincides with the Y-axis. Each of the first inner emitting regions 381 is interposed between the second inner emitting regions 382 positioned on its right and left sides.

An outer end 381D of the first inner emitting region 381 may be at a position lower than or higher than the upper end 361U of the reflection surface 360 (the first reflective region 361).

The outer end 381D of the first inner emitting region 381 is preferably positioned outer than the lower end 331D of the first upper incidence region 331. Thus, most of light incident on the first upper incidence region 331 is emitted from the first inner emitting region 381 to the outside. The outer end 381D of the first inner emitting region 381 is preferably positioned outer than the lower end 341D of the first lower incidence region 341.

The first inner emitting region 381 may be a convex curved surface in the 90-degree section. This adjusts the refracting angle at the emitting surface, thereby controlling light to illuminate in the imaging region. The curvature with the convex curved surface preferably falls within a range of 0.5 to 5 (unit: mm) inclusive. When the lens portion 310 is great in thickness, the first inner emitting region 381 may be a concave curved surface in the 90-degree section. When the lens portion 310 is small in thickness, the first inner emitting region 381 may be a convex curved surface or a flat surface in the 90-degree section.

The angle formed between the first inner emitting region 381 and the horizontal plane (the inclination angle of the first inner emitting region 381) preferably falls within a range of 0 degrees to 30 degrees inclusive. This adjusts the refracting angle at the emitting surface, thereby controlling light to illuminate in the imaging region. The inclination angle of the first inner emitting region 381 is preferably greater than the angle formed between the second inner emitting region 382 and the horizontal plane (the inclination angle of the second inner emitting region). Thus, light is evenly emitted in the imaging region.

(Second Inner Emitting Region of Inner Emitting Region)

As shown in FIG. 1A, the second inner emitting regions 382 are four regions disposed on the right and left opposite sides of the first inner emitting region 381 as seen in a plan view. The center line including the central axis C and equally dividing the central angle for each of two second inner emitting regions 382 disposed symmetrically relative to the central axis C is at a position displaced in the 0-degree direction from the 45-degree direction. Two second inner emitting regions 382 disposed on the right side and two second inner emitting regions 382 disposed on the left side with reference to the Y-axis have line symmetry (vertical symmetry) relative to the Y-axis. Similarly, two second inner emitting regions 382 disposed on the upper side and two second inner emitting regions 382 disposed on the lower side with reference to the X-axis have line symmetry (horizontal symmetry) relative to the X-axis. The second inner emitting regions 382 are not symmetric but asymmetric relative to the center line.

An outer end 382D of the second inner emitting region 382 may be at a position higher than or lower than the upper end 362U of the reflection surface 360 (second reflective region 362).

The outer end 382D of the second inner emitting region 382 is preferably positioned outer than the lower end 332D of the second upper incidence region 332. Thus, most of light incident on the second upper incidence region 332 is emitted from the second inner emitting region 382 to the outside. The outer end 382D of the second inner emitting region 382 is preferably positioned outer than the lower end 342D of the second lower incidence region 342.

The second inner emitting region 382 may be a convex curved surface in the 45-degree section. This adjusts the refracting angle at the emitting surface, thereby controlling light to illuminate in the imaging region. The curvature with the convex curved surface preferably falls within a range of 0.5 mm to 10 mm inclusive. When the lens portion 310 is great in thickness, the second inner emitting region 382 may be a concave curved surface in the 45-degree section. When the lens portion 310 is small in thickness, the second inner emitting region 382 may be a convex curved surface or a flat surface in the 45-degree section.

The angle formed between the second inner emitting region 382 and the horizontal plane (the inclination angle of the second inner emitting region 382) preferably falls within a range of 0 degrees to 20 degrees. This adjusts the refracting angle at the emitting surface, thereby controlling light to illuminate in the imaging region. The inclination angle of the second inner emitting region 382 is preferably smaller than the inclination angle of the first inner emitting region 381. Thus, light is evenly emitted in the imaging region.

(Third Inner Emitting Region of Inner Emitting Region)

As shown in FIG. 1A, the third inner emitting regions 383 are two regions disposed in the cross section (0-degree section) including the X-axis passing through the central axis C as seen in a plan view. The third inner emitting regions 383 have line symmetry (horizontal symmetry) relative to the X-axis. The two third inner emitting regions 383 disposed having the Y-axis interposed between them have line symmetry (vertical symmetry) relative to the Y-axis. The center line equally dividing the third inner emitting regions 383 coincides with the X-axis. Each of the third inner emitting regions 383 is interposed between the second inner emitting regions 382 positioned on its upper and lower sides.

An outer end 383D of the third inner emitting region 383 may be at a position higher or lower than the upper end 363U of the reflection surface 360 (the third reflective region 363).

The outer end 383D of the third inner emitting region 383 is preferably positioned outer than the lower end 333D of the third upper incidence region 333. Thus, most of light incident on the third upper incidence region 333 is emitted from the third inner emitting region 383 to the outside. The outer end 383D of the third inner emitting region 383 is preferably positioned outer than the lower end 343D of the third lower incidence region 343.

The third inner emitting region 383 may be a convex curved surface in the 0-degree section. This adjusts the refracting angle at the emitting surface, thereby controlling light to illuminate in the imaging region. The curvature with the convex curved surface preferably falls within a range of 0.5 mm to 5 mm inclusive. When the lens portion 310 is great in thickness, the third inner emitting region 383 may be a concave curved surface in the 0-degree section. When the lens portion 310 is small in thickness, the third inner emitting region 383 may be a convex curved surface or a flat surface in the 0-degree section.

The angle formed between the third inner emitting region 383 and the horizontal plane (the inclination angle of the third inner emitting region 383) preferably falls within a range of 0 degrees to 30 degrees inclusive. This adjusts the refracting angle at the emitting surface, thereby controlling light to illuminate in the imaging region. The inclination angle of the third inner emitting region 383 is preferably greater than the inclination angle of the second inner emitting region 382. Thus, light is evenly emitted in the imaging region.

(Outer Emitting Region of Emitting Surface)

The outer emitting region 390 of the emitting surface 370 is the surface that emits mainly light that is incident on the lower incidence region 340 and reflected at the reflection surface 360 to the outside. The outer emitting region 390 is plane-like perpendicular to the central axis C. The outer emitting region 390 is spaced apart from the central axis C.

The inner end of the outer emitting region 390 is preferably positioned outer than the upper incidence region 330 and the lower incidence region 340.

Provision of the inward surface 371 permits reducing the height of the lens portion 310. Specifically, the outer end of the projecting inner emitting region 380 can be at a position lower than the outer emitting region 390. Accordingly, despite the inner emitting region 380 projecting, the height of the top of the inner emitting region 380 may be at a position as high as or lower than the outer emitting region 390. This reduces the height of the light source module 1000. Therefore, for example when the light source module 1000 is installed as a camera-use light source for a smartphone or the like, a thin smartphone is implemented.

As has been described above, because the lens portion used in the light source module according to the present embodiment has 2-fold rotational symmetry, light output therefrom also has 2-fold rotational symmetry. Accordingly, when a plurality of lens portions are used, the orientation of each of the lens portions is preferably adjusted.

For example, as shown in FIG. 1A, in the case in which one light source module 1000 includes the light guide member 300 including two lens portions 310 (311, 312), preferably the orientation of each of the lens portions 310 is adjusted when disposed, so that the combination of the two lens portions 310 (which is referred to as the lens group) has line symmetry. In more detail, as shown in FIGS. 1A and 3 and others, when the first lens portion 311 and the second lens portion 312 are disposed having their respective rotation axes C juxtaposed to each other in the Y direction, they are preferably disposed so that two first upper incidence regions 331 of their respective incidence surfaces are disposed in the Y direction (in the 90-degree section). The two lens portions 310 being disposed in this manner increases the amount of light emitted in the 45-degree direction to be greater than that in the 0-degree direction and the 180-degree direction as seen in a top view.

The region irradiated with light with such a light source module 1000 is rectangular. In many cases, the imaging region of a camera becomes a rectangle of which aspect ratio is, for example, 4:3 or 16:9. In such cases, the light source module 1000 including two lens portions 310 disposed as described above realizes even emission of light to the imaging region.

(Flange Part)

Next, a description will be given of the flange part 400 that surrounds the lens portion 310. The flange part 400 that is part of the light guide member 300 is a member provided at a site not contributing to the light distribution control, and also is a member positioned at a portion bonded to the supporting part 510 of the supporting member 500 that will be described later. The flange part 400 is integrated with the lens portion 310, and is formed of the identical member.

The flange part 400 is positioned on the emitting surface 370 side of the lens portion 310, that is, on the upper side as seen in a cross-sectional view. The flange part 400 is exposed at the upper surface of the light source module 1000 around the emitting surface 370, and forms part of the upper surface of the light source module 1000. Furthermore, the upper surface of the flange part 400 may be a surface continuous to and identical to the outer emitting region 390 of the emitting surface 370 of the lens portion 310. The lower surface of the flange part 400 is continuous to the upper end of the reflection surface 360 of the lens portion 310, and spaced apart from the lower end of the reflection surface 360.

The flange part 400 may include, at its outer edge, a projection that projects downward. As shown in FIGS. 1B and 1C, the projection is spaced apart from the lens portion 310, and connected to the inner wall of the opening of the supporting member 500. Provision of such a projection at the outer periphery of the flange part 400 improves the strength of the light guide member 300. This also improves the bonding strength with the supporting member 500.

When the light guide member 300 includes a plurality of lens portions 310 (for example, the two lens portions consisting of the first lens portion 311 and the second lens portion 312), the flange part 400 can be disposed additionally between them. This provides the light guide member 300 that integrally includes the plurality of lens portions 310. The above-described projection may be provided so as to surround the outer periphery of each of the two lens portions 310. The projection of the flange part 400 is preferably smaller in length than a leg part 520 of the supporting member 500, which will be described later. The lower end of the flange part 400 (the lower end of the projection) is preferably positioned higher than the lower end of the reflection surface 360 of the lens portion 310.

(Supporting Member)

The supporting member 500 forms part of the cover member 200 and supports the light guide member 300. The supporting member 500 supports the light guide member 300 so that the lens portion 310 of the light guide member 300 is disposed immediately above the light source 100, in more detail, so that the lens portion 310 is disposed immediately above the light source 100 while avoiding contact with the light emission surface 110 of the light source 100.

The supporting member 500 includes the supporting part 510 that supports the light guide member 300, and the leg part 520 positioned below the supporting part 510. The supporting part 510 surrounds the outer periphery of the light guide member 300, and is bonded to the flange part 400 of the light guide member 300. The leg part 520 is disposed on the side outer than the light source 100, and bonded, using an adhesive agent or the like, onto a wiring board 600 where the light source 100 is mounted. The upper surface of the supporting member 500 forms part of the upper surface of the light source module 1000. The lateral surface of the supporting member 500 forms part of the lateral surface of the light source module 1000.

The supporting member 500 may be formed of a material having the light shielding property, that is, which does not transmit light from the light source 100. Here, the light shielding property means that light from the light source 100 is blocked by 50% or more, preferably 80% or more, and further preferably 90% or more. The supporting member 500 may be formed of a light-transmissive member such as polycarbonate, acrylic resin, silicone resin, epoxy resin or the like. Furthermore, such a light-transmissive member as the base material preferably includes a material having the light shielding property. A light reflective light shielding material may be titanium oxide, aluminum oxide, zirconium oxide or the like. A light absorbing light shielding material may be carbon, paint or the like. One of or a combination of the foregoing materials may be used.

(Light Source)

The light source 100 may be a semiconductor light emitting element such as an LED (Light Emitting Diode) or a light emitting device including the semiconductor light emitting element. For example, the light source 100 shown in FIGS. 7A to 7C is an exemplary light emitting device that includes a semiconductor light emitting element. In more detail, the light emitting device that is the light source 100 includes a semiconductor light emitting element 120, and a light-transmissive member 130 disposed on the semiconductor light emitting element 120 via a bonding member 140. The bonding member 140 is disposed also on the lateral surface of the semiconductor light emitting element 120. The lateral surface of the semiconductor light emitting element 120 is covered with the covering member 150 via the bonding member 140. The light source 100 includes a light emission surface 110 at its upper surface. The light source 100 may include a light emission surface also at its lateral surface. Preferably, the light source 100 includes the light emission surface just at the upper surface, or the upper surface and around the upper end of the lateral surface. The shape of the light emission surface 110 as seen in a top view may be polygonal such as quadrangular, triangular, pentagonal, hexagonal or the like, or circular or oval. Preferably, the shape of the light emission surface 110 as seen in a top view is square. With the square light emission surface 110, preferably the position of the light emission surface 110 is adjusted so that the four corners of the upper incidence region 330 (the second lower incidence region 342) of the incidence surface 320 of the lens portion 310 and those of the light emission surface 110 correspond to each other.

The semiconductor light emitting element 120 includes a semiconductor layered body 121 and an element electrode 122. The semiconductor layered body 121 include a semiconductor layer that includes a light emitting layer. The semiconductor layered body 121 may further include a light-transmissive substrate such as sapphire or the like. An exemplary semiconductor layered body may include three semiconductor layers, namely, a first conductivity type semiconductor layer (for example, an n-type semiconductor layer), a light emitting layer (an active layer), and a second conductivity type semiconductor layer (for example, a p-type semiconductor layer). A semiconductor layer capable of emitting ultraviolet light or visible light from blue- to green-color light may be made of a semiconductor material such as a Group III-V compound semiconductor. Specifically, a nitride-based semiconductor material such as $In_XAl_YGa_{1-X-Y}N$ ($0 \leq X$, $0 \leq Y$, $X+Y \leq 1$) may be used. A semiconductor layered body capable of emitting red-color light may be made of GaAs, GaAlAs, GaP, InGaAs, InGaAsP or the like. The thickness of the semiconductor layered body 121 may fall within a range of 3 μm to 500 μm inclusive, for example. Such a semiconductor light emitting element 120 may be used by one in number.

The element electrode 122 has its lateral surface covered with the covering member 150. The lower surface thereof is exposed outside the covering member 150. The lower surface of the element electrode 122 may be exposed outside as it is, of may be covered with a metal layer 160 as shown in FIGS. 7B and 7C.

The element electrode 122 may be formed by an arbitrary thickness with any known material and structure known in the art. For example, the thickness of the element electrode 122 preferably falls within a range of 1 μm to 300 μm inclusive. The element electrode 122 may be a good conductor and, for example, metal such as Cu is suitable.

The covering member 150 is light reflective, and directly or indirectly covers the lateral surface of the semiconductor light emitting element 120. The covering member 150 is capable of reflecting light from the semiconductor light emitting element 120 and, for example, may be made of a resin material containing a light-reflective substance. The covering member 150 preferably reflects light from the semiconductor light emitting element 120 by 70% or more, more preferably 80% or more, and further preferably 90% or more.

In the covering member 150, for example, the base material is preferably a resin material of which main component is thermosetting resin such as silicone resin, silicone modified resin, epoxy resin, or phenolic resin. The light-reflective substance contained in the resin material may be, for example, a white-color substance. Specifically, for example, titanium oxide, silicon oxide, zirconium oxide, potassium titanate, aluminum oxide, aluminum nitride, boron nitride, or mullite is suitable. The light-reflective substance may be granular, fibrous, or flaky.

The light-transmissive member 130 is capable of transmitting light from the semiconductor light emitting element 120, and forms the light emission surface 110 of the light source 100. The light-transmissive member 130 may be a light-transmissive resin material, glass or the like. For example, the light-transmissive member 130 may be thermosetting resin such as silicone resin, silicone modified resin, epoxy resin, or phenolic resin. Alternatively, the light-transmissive member 130 may be thermosetting resin such as polycarbonate resin, acrylic resin, methylpentene resin, or polynorbornene resin. In particular, silicone resin that is excellent in light resistance and heat resistance is suitable. The light-transmissive member 130 preferably transmits light from the semiconductor light emitting element by 70% or more, more preferably 80% or more, and further preferably 90% or more. The light-transmissive member 130 may contain a fluorescent material that will be described below, or a diffusing member.

The fluorescent material in the present embodiment absorbs light from the semiconductor light emitting element 120, and converts the light into light of different wavelength. In other words, the fluorescent material is capable of being excited by light emitted from the semiconductor light emitting element 120. For example, a fluorescent material capable of being excited by a blue-color light emitting element or a ultraviolet light emitting element may be a cerium-activated yttrium-aluminum-garnet-based fluorescent material (YAG:Ce), cerium-activated lutetium-aluminum-garnet-based fluorescent material (LAG:Ce), europium and/or chromium-activated nitrogen-containing calcium aluminosilicate-based fluorescent material ($CaO$—$Al_2O_3$—$SiO_2$,), europium-activated silicate-based fluorescent material ($(Sr,Ba)_2SiO_4$), a nitride-based fluorescent material such as a β-sialon fluorescent material, a CASN-based fluorescent material, or an SCASN-based fluorescent material, a KSF-based fluorescent material ($K_2SiF_6$:Mn), a sulfide-based fluorescent material, a quantum dot fluorescent material or the like. A combination of any one of these fluorescent materials and a blue-color light emitting element or an ultraviolet light emitting element provides a light emitting device emitting light in any of various colors (for example, a whitish-color light emitting device). One or a plurality of types of these fluorescent materials may be used. When a plurality of types of fluorescent materials is used, they may be blended or layered.

Furthermore, the wavelength conversion member may contain any of various types of fillers for the purpose of adjusting viscosity or the like.

The bonding member 140 bonds the semiconductor light emitting element 120 and the light-transmissive member 130 to each other. Furthermore, the bonding member 140 covers the lateral surface of the semiconductor light emitting element 120, to guide light emitted from the lateral surface of the semiconductor light emitting element 120 to the light-transmissive member 130. The bonding member 140 may be formed of a light-transmissive resin material. For example, a resin material of which main component is thermosetting resin such as silicone resin, silicone modified resin, epoxy resin, or phenolic resin is preferable. The bonding member 140 preferably transmits light from the semiconductor light emitting element by 70% or more, more preferably 80% or more, and further preferably 90% or more.

The metal layer 160 preferably withstands corrosion and oxidation better than the element electrode 122 of the semiconductor light emitting element 120 does. The metal layer 160 may be formed of a single layer of a single material, or may be layers of different materials. In particular, a high-melting-point metal material is preferable, such as Ru, Mo, or Ta. By the high-melting-point metal material being provided between the element electrode and the outermost layer of the semiconductor light emitting element, a diffusion preventing layer capable of minimizing diffusion of Sn contained in solder into the electrode or any layer near the electrode in the light emitting element is implemented. A layered structure including such a diffusion preventing layer may be Ni/Ru/Au, Ti/Pt/Au or the like. The thickness of the diffusion preventing layer (for example, Ru) is preferably about 10 Å to 1000 Å.

(Wiring Board)

The wiring board 600 is provided for the light source 100 to be disposed thereon. The wiring board 600 includes a base substrate, and a wiring disposed on the upper surface of the base substrate. The wiring and the light source 100 are electrically connected and fixed to each other with a conductive adhesive agent or the like. Note that, FIG. 1B and others do not show the adhesive agent. The base substrate may be formed of an insulating material such as ceramic, glass epoxy, or phenolic paper. Alternatively, as the base substrate, a conductive material using metal such as aluminum may be used. In this case, an insulating layer is provided between the conductive base substrate and the wiring. The shape of the wiring board may be, for example, quadrangular or circular. The material of the wiring may be, for example, Cu or Ag. The wiring may be provided with, at its surface, Au plating or solder plating. Alternatively, in place of such soldering, the wiring may be provided with a water-soluble flux. The insulating layer may be formed of, for example, epoxy resin, silicone or the like.

DENOTATION OF REFERENCE NUMERALS

1000: light source module
100: light source
110: light emission surface
120: semiconductor light emitting element
121: semiconductor layered body
122: element electrode
130: light-transmissive member
140: bonding member
150: covering member
160: metal layer
200: cover member
300: light guide member
310: lens portion (311: first lens portion, 312: second lens portion)
320: incidence surface
330: upper incidence region
331: first upper incidence region
332: second upper incidence region
333: third upper incidence region
340: lower incidence region
341: first lower incidence region
341U: upper end of first lower incidence region
341D: lower end of first lower incidence region
342: second lower incidence region
342U: upper end of second lower incidence region
342D: lower end of second lower incidence region
343: third lower incidence region
343U: upper end of third lower incidence region
343D: lower end of third lower incidence region
Ld: boundary
L1: first center line
L2: second center line
L3: third center line
θ11: central angle of first upper incidence region
θ12: central angle of second upper incidence region
θ13: central angle of third upper incidence region
θ21: inclination angle of first upper incidence region
θ22: inclination angle of second upper incidence region
θ23: inclination angle of third upper incidence region
θ31: inclination angle of first lower incidence region
θ32: inclination angle of second lower incidence region
θ33: inclination angle of third lower incidence region
350: fourth incidence region
360: reflection surface
361: first reflective region
361U: upper end of first reflective region
362: second reflective region
362U: upper end of second reflective region
363: third reflective region
363U: upper end of third reflective region
θ41: inclination angle of first reflective region
θ42: inclination angle of second reflective region
θ43: inclination angle of third reflective region
370: emitting surface
371: inward surface
380: inner emitting region
381: first inner emitting region
381D: outer end of first inner emitting region
382: second inner emitting region
382D: outer end of second inner emitting region
383: third inner emitting region
383D: outer end of third inner emitting region
390: outer emitting region
400: flange part
C: central axis
500: supporting member
510: supporting part
520: leg part
600: wiring board

What is claimed is:

1. A light source module comprising:
a light source having an upper surface comprising a light emission surface; and
a light guide member comprising a lens portion having a central axis that extends through a center of the light emission surface,
wherein the lens portion comprises:
an incidence surface that is recessed and opposes the light emission surface of the light source such that light from the light source is incident on the incidence surface,
a reflection surface disposed outward of the incidence surface and configured to reflect part of the light that is incident on the incidence surface to an outside, and
an emitting surface configured to emit part of the light that is incident on the incidence surface and the light reflected at the reflection surface,
wherein the incidence surface comprises an upper incidence region positioned on an upper side, and a lower incidence region positioned lower than the upper incidence region, in a cross section that includes the central axis,
wherein the lower incidence region has 2-fold rotational symmetry relative to the central axis,
wherein the lower incidence region comprises a first lower incidence region, and a second lower incidence region at a position rotated by 45 degrees from the first lower incidence region,
wherein a height of the second lower incidence region is greater than a height of the first lower incidence region, and
wherein a distance between a lower end of the first lower incidence region and the central axis is less than a distance between a lower end of the second lower incidence region and the central axis.

2. The light source module according to claim 1, wherein the height of the second lower incidence region is 120% to 200% as great as the height of the first lower incidence region.

3. The light source module according to claim 1, wherein a central angle of the first lower incidence region is greater than a central angle of the second lower incidence region.

4. The light source module according to claim 1, wherein an angle formed between the first lower incidence region and a plane perpendicular to the central axis is within a range of 70 degrees to 90 degrees inclusive.

5. The light source module according to claim 1, wherein an angle formed between the second lower incidence region and a plane perpendicular to the central axis falls within a range of 70 degrees to 90 degrees inclusive.

6. The light source module according to claim 1, wherein an angle formed between the lower incidence region and a plane perpendicular to the central axis is greater than an angle formed between the upper incidence region and the plane perpendicular to the central axis.

7. The light source module according to claim 1,
wherein the upper incidence region comprises a first upper incidence region, and a second upper incidence region at a position rotated by 45 degrees from the first upper incidence region, and
wherein an angle formed between the first upper incidence region and a plane perpendicular to the central axis is greater than an angle formed between the second upper incidence region and the plane perpendicular to the central axis.

8. The light source module according to claim 7,
wherein the angle formed between the first upper incidence region and the plane perpendicular to the central axis falls within a range of 10 degrees to 40 degrees inclusive, and
wherein the angle formed between the second upper incidence region and the plane perpendicular to the central axis falls within a range of 10 degrees to 40 degrees inclusive.

9. The light source module according to claim 1, wherein the incidence surface further comprises a fourth incidence region that is positioned on the central axis and perpendicular to the central axis.

10. The light source module according to claim 1, wherein the height of the first lower incidence region falls within a range of 20% to 60% of a height of a center of the incidence surface.

11. The light source module according to claim 1, wherein the height of the second lower incidence region falls within a range of 40% to 80% of a height of a center of the incidence surface.

12. The light source module according to claim 1,
wherein the emitting surface comprises an inner emitting region positioned on the central axis, and an outer emitting region positioned along an outer peripheral of the inner emitting region, and
wherein the inner emitting region is a curved surface that is convex in a light extraction direction.

13. The light source module according to claim 12,
wherein the inner emitting region comprises a first inner emitting region located above the first lower incidence region, and
wherein, in a plan view, an outer end of the first inner emitting region is positioned outward of the lower end of the first lower incidence region.

14. The light source according to claim 12,
wherein the upper incidence region comprises a first upper incidence region, and a second upper incidence region at a position rotated by 45 degrees from the first upper incidence region,
wherein the inner emitting region comprises a first inner emitting region located above the first upper incidence region, and
wherein, in a plan view, an outer end of the first inner emitting region is positioned outward of a lower end of the first upper incidence region.

15. The light source module according to claim 12,
wherein the inner emitting region comprises a first inner emitting region located above the first lower incidence region, and a second inner emitting region located above the second lower incidence region, and
wherein, in a plan view, an outer end of the second inner emitting region is positioned outward of the lower end of the second lower incidence region.

16. The light source according to claim 12,
wherein the upper incidence region comprises a first upper incidence region, and a second upper incidence region at a position rotated by 45 degrees from the first upper incidence region,
wherein the inner emitting region comprises a first inner emitting region located above the first lower incidence region, and a second inner emitting region located above the second lower incidence region, and
wherein, in a plan view, an outer end of the second inner emitting region is positioned outward of a lower end of the second upper incidence region.

17. A light source module comprising:
a light source having an upper surface comprising a light emission surface; and
a light guide member comprising a lens portion having a central axis that extends through a center of the light emission surface,
wherein the lens portion comprises:
an incidence surface that is recessed and opposes the light emission surface of the light source such that light from the light source is incident on the incidence surface,
a reflection surface disposed outward of the incidence surface and configured to reflect part of the light that is incident on the incidence surface to an outside, and
an emitting surface configured to emit part of the light that is incident on the incidence surface and the light reflected at the reflection surface,
wherein the incidence surface comprises an upper incidence region positioned on an upper side, and a lower incidence region positioned lower than the upper incidence region, in a cross section that includes the central axis,
wherein the lower incidence region has 2-fold rotational symmetry relative to the central axis,
wherein the lower incidence region comprises a first lower incidence region, and a second lower incidence region at a position rotated by 45 degrees from the first lower incidence region,
wherein a height of the second lower incidence region is greater than a height of the first lower incidence region,
wherein the upper incidence region comprises a first upper incidence region, and a second upper incidence region at a position rotated by 45 degrees from the first upper incidence region, and
wherein an angle formed between the first upper incidence region and a plane perpendicular to the central axis is greater than an angle formed between the second upper incidence region and the plane perpendicular to the central axis.

* * * * *